US012763147B2

(12) United States Patent
Yu et al.

(10) Patent No.: US 12,763,147 B2
(45) Date of Patent: Oct. 13, 2026

(54) NON-VOLATILE MEMORY DEVICE, STORAGE DEVICE, AND OPERATION METHOD THEREOF

(71) Applicant: Samsung Electronics Co., Ltd., Suwon-si (KR)

(72) Inventors: Hyungseok Yu, Suwon-si (KR); Seungyeon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 22 days.

(21) Appl. No.: 18/976,849

(22) Filed: Dec. 11, 2024

(65) Prior Publication Data

US 2025/0232815 A1 Jul. 17, 2025

(30) Foreign Application Priority Data

Jan. 17, 2024 (KR) ........................ 10-2024-0007638

(51) Int. Cl.

| | |
|---|---|
| ***G11C 16/10*** | (2006.01) |
| ***G11C 16/08*** | (2006.01) |
| ***G11C 16/34*** | (2006.01) |

(52) U.S. Cl.

CPC ............ *G11C 16/102* (2013.01); *G11C 16/08* (2013.01); *G11C 16/3459* (2013.01)

(58) Field of Classification Search

CPC ... G11C 16/102; G11C 16/08; G11C 16/3459; G11C 11/5628; G11C 16/0483; G11C 16/10; G11C 16/32; G06F 3/0659; G06F 3/0653; G06F 3/0658; G06F 3/0679

See application file for complete search history.

(56) References Cited

U.S. PATENT DOCUMENTS

| | | | |
|---|---|---|---|
| 10,564,869 | B2 | 2/2020 | Mun et al. |
| 2005/0207229 | A1 | 9/2005 | Takeuchi |
| 2014/0215244 | A1 | 7/2014 | Hong |
| 2015/0205540 | A1 | 7/2015 | Yoo et al. |
| 2016/0162215 | A1 | 6/2016 | Jayaraman et al. |
| 2016/0266835 | A1 | 9/2016 | Kasorla et al. |
| 2017/0139590 | A1 | 5/2017 | Hsu et al. |
| 2021/0382804 | A1 | 12/2021 | Alrod et al. |
| 2022/0350504 | A1 | 11/2022 | Yu et al. |
| 2024/0395344 | A1* | 11/2024 | Ramanan ........... G11C 16/0483 |

FOREIGN PATENT DOCUMENTS

| | | | |
|---|---|---|---|
| KR | 10-2015-0087646 | A | 7/2015 |
| KR | 10-2019-0052884 | A | 5/2019 |

* cited by examiner

*Primary Examiner* — Huan Hoang

(74) *Attorney, Agent, or Firm* — Fish & Richardson P.C.

(57) ABSTRACT

A storage device includes a storage controller configured to transmit either a normal program command or a slow program command to a non-volatile memory via data lines, and the non-volatile memory comprising a plurality of non-volatile memories. Each of the plurality of non-volatile memories is configured to output a ready/busy signal to the storage controller during a first program time in response to the normal program command, and output a ready/busy signal to the storage controller during a second program time, the second program time being is different from the first program time, in response to the slow program command.

20 Claims, 19 Drawing Sheets

NON-VOLATILE MEMORY DEVICE, STORAGE DEVICE, AND OPERATION METHOD THEREOF

CROSS-REFERENCE TO RELATED APPLICATION

This application is based on and claims priority under 35 U.S.C. § 119 to Korean Patent Application No. 10-2024-0007638, filed on Jan. 17, 2024, in the Korean Intellectual Property Office, the disclosure of which is incorporated by reference herein in its entirety.

BACKGROUND

Various example embodiments of the inventive concepts relate to a semiconductor memory, and more particularly, to a non-volatile memory device, a storage device, and an operation method of the storage device.

Semiconductor memories are classified into volatile memory devices, such as a static random access memory (SRAM) and a dynamic random access memory (DRAM), in which the stored data is lost when the power supply is cut off, and non-volatile memory devices, such as flash memory devices, a phase-change random access memory (PRAM), a magnetic random access memory (MRAM), a resistive random access memory (RRAM), and a ferroelectric random access memory (FRAM), in which the stored data is maintained even when the power supply is cut off.

The flash memory devices have been widely used as storage devices that are high-capacity storage media. The storage devices store data under the control by host devices, such as a computer, a smartphone, and a smart pad. The storage devices include a device that stores data in a magnetic disk, such as a hard disk drive (HDD), and a device that stores data in a semiconductor memory, particularly a non-volatile memory, such as a solid state drive (SSD) and a memory card.

Each of the storage devices may include a plurality of non-volatile memories. Data may be distributed and stored in each of the plurality of non-volatile memories of the storage device. This data management method is referred to as data interleaving. In order to increase and/or maximize the parallelism of non-volatile memory devices, the storage device may distribute and allocate consecutive logical memory regions to channels, ways, and planes. Data is written and read in the interleaving manner via a plurality of channels, which causes an increase in current consumption.

SUMMARY

Various example embodiments of the inventive concepts provide a non-volatile memory device with improved performance, a storage device, and a method of operating the storage device.

According to various example embodiments the inventive concepts, there is provided a storage controller configured to transmit either a normal program command or a slow program command to a non-volatile memory via data lines, and the non-volatile memory comprising a plurality of non-volatile memories. Each of the plurality of non-volatile memories is configured to output a ready/busy signal to the storage controller during a first program time in response to the normal program command, and output a ready/busy signal to the storage controller during a second program time, the second program time being is different from the first program time, in response to the slow program command.

According to various example embodiments of the inventive concepts, there is provided a method of operating a storage device including a storage controller and a non-volatile memory, the method comprising transmitting a normal program command by the storage controller to the non-volatile memory via data lines, outputting a ready/busy signal by the non-volatile memory to the storage controller during a first program time in response to the normal program command, transmitting, a second level program command by the storage controller to the non-volatile memory via the data lines, and outputting a ready/busy signal by the non-volatile memory to the storage controller during a second program time in response to the second level program command. The second program time is longer than the first program time.

According to another various example embodiment of the inventive concepts, there is provided a non-volatile memory device including a memory cell array comprising a plurality of memory cells, a row decoder connected to the memory cells via a word line and applying a program voltage and a verification voltage to the word line during a program operation, a page buffer circuit connected to the memory cell array via a bit line and applying a bit line voltage corresponding to data to be programmed to a selected bit line, an input/output (I/O) circuit receiving data or commands from outside via data lines and transmitting the data to the page buffer circuit, and a logic control circuit configured to output a ready/busy signal during a first program time in response to a normal program command received via the I/O circuit, and output a ready/busy signal during a second program time in response to a slow program command received via the I/O circuit. The second program time is longer than the first program time.

BRIEF DESCRIPTION OF THE DRAWINGS

Various example embodiments will be more clearly understood from the following detailed description taken in conjunction with the accompanying drawings in which.

DETAILED DESCRIPTION

Hereinafter, various example embodiments are described clearly and in detail so that a person skilled in the art can easily practice the inventive concepts.

Figure 1:
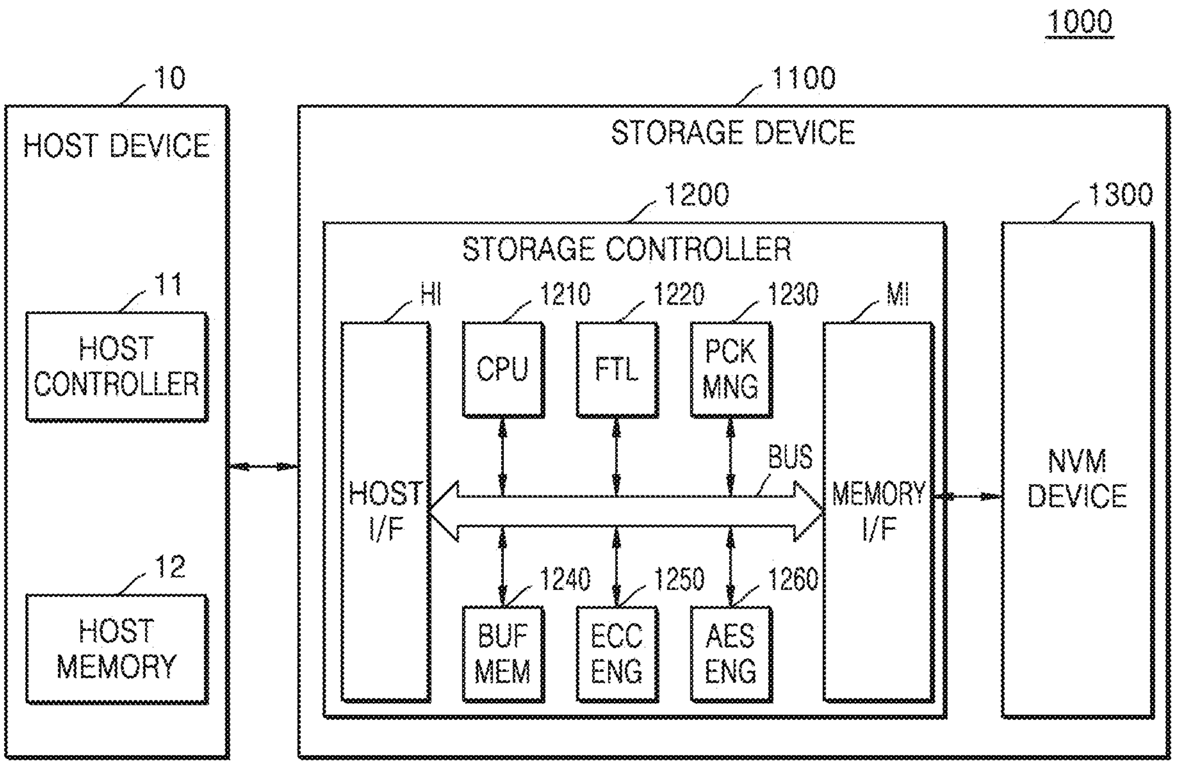
FIG. 1 is a block diagram showing a storage system according to various example embodiments.

FIG. 1 is a block diagram showing a storage system 1000 according to various example embodiments.

Referring to FIG. 1, the storage system 1000 may include a host device 10 and a storage device 1100. Also, the storage device 1100 may include a storage controller 1200 and a non-volatile memory device 1300. In addition, according to various example embodiments, the host device 10 may include a host controller 11 and a host memory 12. The host memory 12 may function as a buffer memory for temporarily storing data to be transmitted to the storage device 1100 or data transmitted from the storage device 1100.

The storage device 1100 may include storage media for storing data in response to a request from the host device 10. For example, the storage device 1100 may include at least one of a solid state drive (SSD), an embedded memory, and a removable external memory. However, example embodiments are not limited thereto. When the storage device 1100 includes the SSD, the storage device 1100 may include a device that complies with the non-volatile memory express (NVMe) standard. When the storage device 1100 includes the embedded memory or the external memory, the storage device 1100 may include a device that complies with the universal flash storage (UFS) or embedded multi-media card (eMMC) standard. The host device 10 and the storage device 1100 may each generate and transmit a packet according to the adopted standard protocol.

When the non-volatile memory device 1300 of the storage device 1100 includes a flash memory, the flash memory may include a 2D negative-AND (NAND) memory array or a 3D (or vertical) NAND (VNAND) memory array. In another example, the storage device 1100 may include various other types of non-volatile memories. For example, the storage device 1100 may include a magnetic random access memory (MRAM), a spin-transfer torque MRAM, a conductive bridging RAM (CBRAM), a ferroelectric RAM (FeRAM), a phase RAM (PRAM), a resistive RAM, and various other types of memories. However, example embodiments are not limited thereto.

According to various example embodiments, the host controller 11 and the host memory 12 may be provided as separate semiconductor chips. Alternatively, in some example embodiments, the host controller 11 and the host memory 12 may be integrated into a single semiconductor chip. For example, the host controller 11 may include any one of a plurality of modules provided in an application processor, and the application processor may be provided as a system on chip (SoC). Also, the host memory 12 may include an embedded memory provided in the application processor or a non-volatile memory or a memory module arranged outside of the application processor.

The host controller 11 may manage an operation of storing data (e.g., write data) in a buffer region of the non-volatile memory device 1300 or storing data (e.g., read data) in a buffer region of the non-volatile memory device 1300.

The storage controller 1200 may include a host interface circuit HI, a memory interface circuit MI, and a central processing unit (CPU) 1210. Also, the storage controller 1200 may include a flash translation layer (FTL) 1220, a packet manager 1230, a buffer memory 1240, an error correction code (ECC) engine 1250, and an advanced encryption standard (AES) engine 1260. The storage controller 1200 may further include a working memory (not shown) into which the FTL 1220 is loaded, and data write and read operations for the non-volatile memory may be controlled by the CPU 1210 executing the FTL 1220.

The host interface circuit HI may transmit a packet to and receive a packet from the host device 10. A packet transmitted from the host device 10 to the host interface circuit HI may include a command or data to be written to the non-volatile memory device 1300, and a packet transmitted from the host interface circuit HI to the host device 10 may include a response to the command or data read from the non-volatile memory device 1300. The memory interface circuit MI may transmit data to be written to the non-volatile memory device 1300 to the non-volatile memory device 1300 or receive data read from the non-volatile memory device 1300. The memory interface circuit MI may be configured to comply with standard regulations, such as Toggle and open NAND flash interface (ONFI).

The FTL 1220 may perform several functions, such as address mapping, wear-leveling, and garbage collection. The address mapping operation includes an operation that changes a logical address received from the host into a physical address used to actually store data in the non-volatile memory device 1300. The wear-leveling is related to a technology for reducing or preventing excessive deterioration of specific blocks by ensuring that blocks in the non-volatile memory device 1300 are used more uniformly and may be performed by, for example, a firmware technology that balances erase counts of physical blocks. The garbage collection is related to a technology for securing usable capacity within the non-volatile memory device 1300 by copying valid data of a block to a new block and then erasing the existing block.

The ECC engine 1250 may perform error detection and correction functions on read data read from the non-volatile memory device 1300. The ECC engine 1250 may perform an error detection operation and an error correction operation. The ECC engine 1250 may perform the error detection operation to determine whether an error exists in the data.

More specifically, the ECC engine 1250 may generate parity bits for write data to be written to the non-volatile memory device 1300, and the parity bits generated in this manner may be stored in the non-volatile memory device 1300 together with the write data. When reading data from the non-volatile memory device 1300, the ECC engine 1250 may correct errors in the read data using parity bits read from the non-volatile memory device 1300 along with the read data and may then output the read data with errors corrected.

In various example embodiments, the ECC engine 1250 may use one of a cyclic redundancy check (CRC) (e.g., CRC-16, CRC-32, CRC-64, CRC-128, CRC-256, etc.), a hamming code, a low density parity check (LDPC), a bose-chaudhuri-hocquenghem (BCH) code, a reed-solomon (RS) code, and a viterbi code, and a turbo code and may perform the error detection operation or the error correction operation.

The AES engine 218 may perform at least one of an encryption operation and a decryption operation on data input to the storage controller 1200 using a symmetric-key algorithm.

The packet manager 1230 may generate packets according to the protocol of the interface negotiated with the host device 10 or parse various other types of information from packets received from the host device 10. Also, the buffer memory 1240 may temporarily store data to be written to the non-volatile memory device 1300 or data to be read from the non-volatile memory device 1300. The buffer memory 1240 may be provided inside the storage controller 1200 but may also be placed outside the storage controller 1200.

The storage controller 1200 may communicate with the non-volatile memory device 1300 via a plurality of channels. The non-volatile memory device 1300 may store data or output the stored data under the control by the storage controller 1200. The non-volatile memory device 1300 may include a plurality of non-volatile memories NVM.

In various example embodiments, the storage device 1100 may perform a slow program operation that consumes a small amount of current. For example, the slow program operation may refer to an operation that performs the same function as a normal program operation but may consume less current and have a longer program time. For example, the storage device 1100 may perform a slow program operation that consumes less current than the normal program operation. Alternatively, the storage device 1100 may perform a slow program operation having reduced a peak current.

In various example embodiments, the storage controller 1200 may schedule a slow program command on the basis of the present state. The storage controller 1200 may determine a programming method on the basis of operations that are currently being performed in the non-volatile memory device 1300. The storage controller 1200 may transmit either the normal program command or the slow program command on the basis of the total peak current.

In various example embodiments, the storage controller 1200 may compare the total peak current with the reference current. The storage controller 1200 may transmit the slow program command to the non-volatile memory when the total peak current is greater than the reference current and may transmit the normal program command to the non-volatile memory when the total peak current is less than or equal to the reference current.

The storage device 1100 according to various example embodiments may perform the slow program operation in which the program time increases and the peak current decreases. Accordingly, the total peak current may be reduced or prevented from exceeding the allowable current. Instead of blocking the transmission of the program command due to the peak current, the slow program operation that consumes less current is performed. Accordingly, the performance of the storage device may be improved. The slow program operation is described in more detail with reference to the diagrams below.

Figure 2:
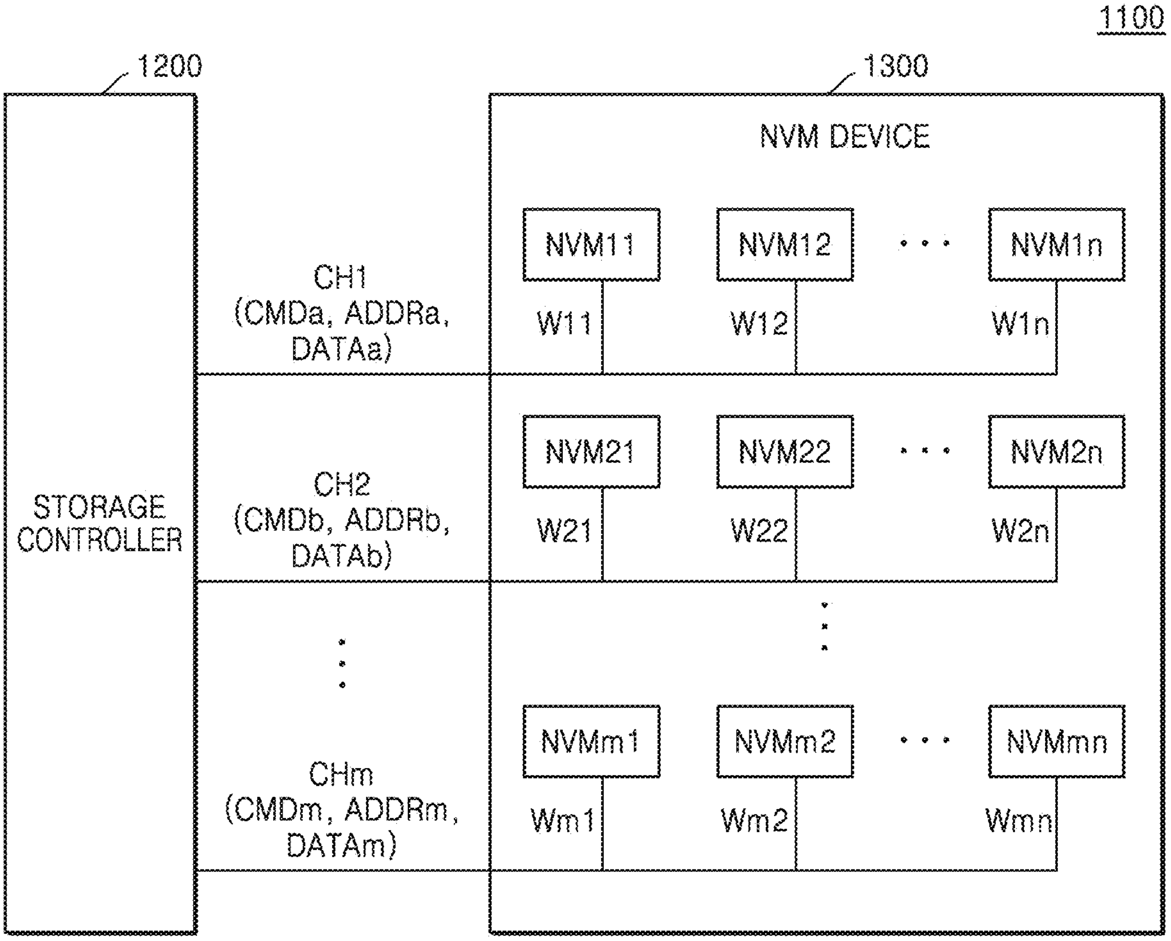
FIG. 2 is a block diagram showing a storage device of FIG. 1 in more detail.

FIG. 2 is a block diagram showing the storage device 1100 of FIG. 1 in more detail.

Referring to FIG. 2, the storage device 1100 may include a non-volatile memory device 1300 and a storage controller 1200. The storage device 1100 may support a plurality of channels CH1 to CHm, and the non-volatile memory device 1300 and the storage controller 1200 may be connected to each other via the plurality of channels CH1 to CHm (or hereinafter referred to as the first to m-th channels CH1 to CHm). For example, the storage device 1100 may be provided as a storage device, such as an SSD.

The non-volatile memory device 1300 may include a plurality of non-volatile memories NVM11 to NVMmn. The non-volatile memories NVM11 to NVMmn may be connected to the plurality of channels CH1 to CHm via corresponding ways, respectively. For example, the non-volatile memories NVM11 to NVMIn may be connected to the first channel CH1 via the ways W11 to Win, and the non-volatile memory devices NVM21 to NVM2*n* may be connected to the second channel CH2 via the ways W21 to W2*n*. For example, each of the non-volatile memories NVM11 to NVMmn may be provided as an arbitrary memory unit that may operate according to individual commands from the storage controller 1200. For example, each of the non-volatile memories NVM11 to NVMmn may be provided as a chip or die, but various example embodiments are not limited thereto.

The storage controller 1200 may transmit signals to or receive signals from the non-volatile memory device 1300 via the plurality of channels CH1 to CHm. For example, the storage controller 1200 may transmit commands CMDa to CMDm, addresses ADDRa to ADDRm, and data DATAa to DATAm to the non-volatile memory device 1300 via the channels CH1 to CHm or may receive data DATAa to DATAm from the non-volatile memory device 1300.

In various example embodiments, the storage controller 1200 may transmit the normal program command to the non-volatile memory device 1300. The storage controller 1200 may transmit the slow program command to the non-volatile memory device 1300.

The storage controller 1200 may select one of the non-volatile memories NVM11 to NVMmn connected to a channel through the corresponding channel and may transmit signals to and receive signals from the selected non-volatile memory device. For example, the storage controller 1200 may select the non-volatile memory NVM11 among the non-volatile memories NVM11 to NVMIn connected to the first channel CH1. The storage controller 1200 may transmit the command CMDa, the address ADDRa, and the data DATAa to the selected non-volatile memory NVM11 via the first channel CH1 or may receive the data DATAa from the selected non-volatile memory NVM11.

The storage controller 1200 may transmit signals to and receive signals from the non-volatile memory device 1300 in parallel via different channels. For example, the storage controller 1200 may transmit the command CMDb to the non-volatile memory device 1300 via the second channel CH2 while transmitting the command CMDa to the non-volatile memory device 1300 via the first channel CH1. For example, the storage controller 1200 may receive data DATAb from the non-volatile memory device 1300 via the second channel CH2 while receiving data DATAa from the non-volatile memory device 1300 via the first channel CH1.

The storage controller 1200 may control all operations of the non-volatile memory device 1300. The storage controller 1200 may control each of the non-volatile memories NVM11 to NVMmn connected to the channels CH1 to CHm by transmitting signals via the channels CH1 to CHm. For example, the storage controller 1200 may control a selected one of the non-volatile memories NVM11 to NVMIn by transmitting the command CMDa and the address ADDRa via the first channel CH1.

Each of the non-volatile memories NVM11 to NVMmn may operate under the control by the storage controller 1200. For example, the non-volatile memory NVM11 may program the data DATAa according to the command CMDa and the address ADDRa provided via the first channel CH1. For example, the non-volatile memory NVM21 may read the data DATAb according to the command CMDb and the address ADDRb provided via the second channel CH2 and may transmit the read data DATAb to the storage controller 1200.

FIG. 2 illustrates that the non-volatile memory device 1300 communicates with the storage controller 1200 via the m channels and the non-volatile memory device 1300 includes the n non-volatile memory devices corresponding to each channel. However, the number of channels and the number of non-volatile memory devices connected to one channel may be changed diversely.

In various example embodiments, each of the plurality of non-volatile memories NVM11 to NVMmn may perform a first program operation (i.e., the normal program operation) during a first program time tPROG1 in response to the normal program command. Each of the plurality of non-volatile memories NVM11 to NVMmn may perform a second program operation (i.e., the slow program operation) during a second program time tPROG2 in response to the slow program command.

Figure 3:
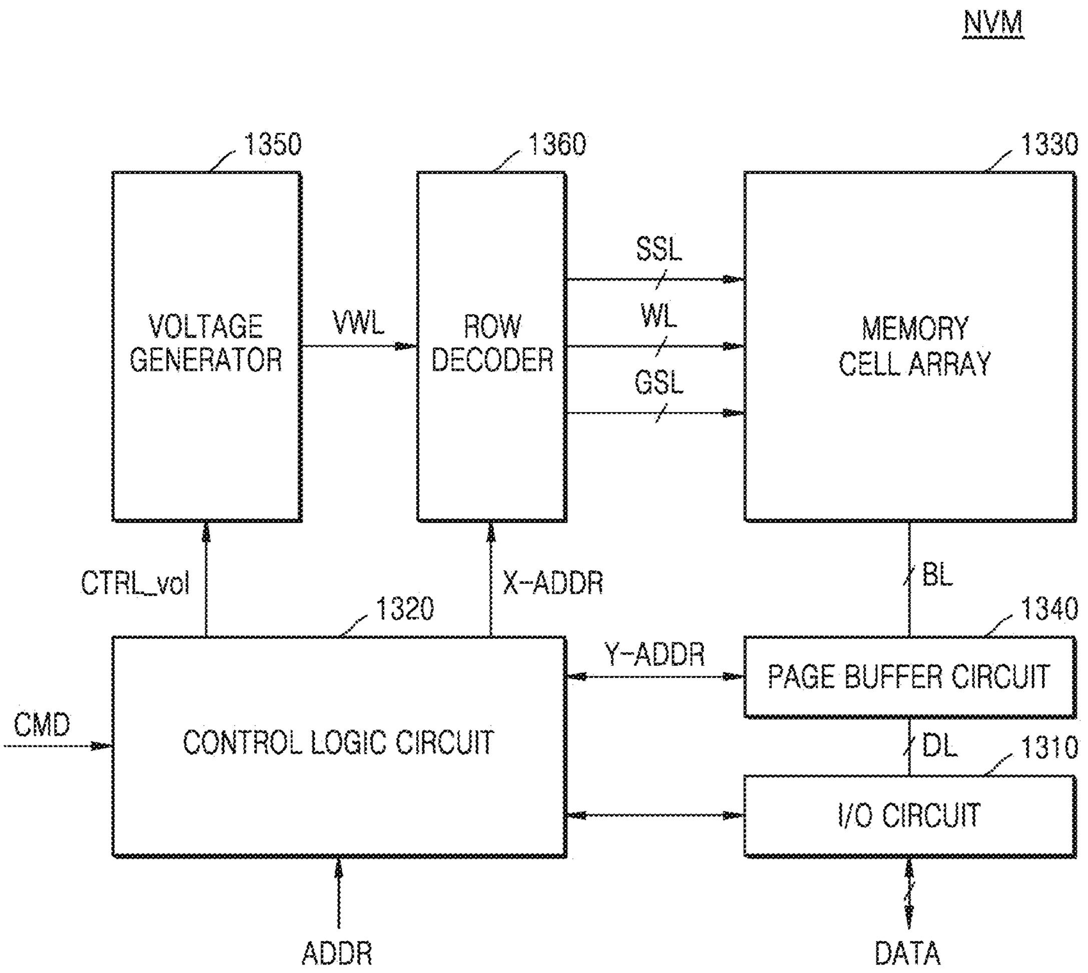
FIG. 3 is a block diagram showing a non-volatile memory of FIG. 2 in more detail.

FIG. 3 is a block diagram showing the non-volatile memory NVM of FIG. 2 in more detail.

Referring to FIGS. 1, 2, and 3, the non-volatile memory NVM may include an input/output circuit 1310, a control logic circuit 1320, a memory cell array 1330, a page buffer circuit 1340, a voltage generator 1350, and a row decoder 1360. Although not shown in FIG. 3, the non-volatile memory NVM may further include a column logic, a pre-decoder, a temperature sensor, a command decoder, an address decoder, or the like. However, example embodiments are not limited thereto.

The control logic circuit 1320 may control all various operations inside the non-volatile memory NVM. The control logic circuit 1320 may output various control signals in response to a command CMD and/or an address ADDR from the input/output circuit 1310. For example, the control logic circuit 1320 may output a voltage control signal CTRL_vol, a row address X-ADDR, and a column address Y-ADDR.

In various example embodiments, the control logic circuit 1320 may output a ready/busy signal. For example, the control logic circuit 1320 may generate and output a ready/busy signal in a busy state during the first program time tPROG1 in response to the general program command. The control logic circuit 1320 may generate and output a ready/busy signal in a busy state during the second program time tPROG2 in response to the slow program command.

The memory cell array 1330 may include a plurality of memory blocks, and each of the memory blocks may include a plurality of memory cells. The memory cell array 1330 may be connected to the page buffer circuit 1340 via bit lines BL and may be connected to the row decoder 1360 via word lines WL, string selection lines SSL, and ground selection lines GSL.

In various example embodiments, the memory cell array 1330 may include a 3-dimensional memory cell array, and the 3-dimensional memory cell array may include a plurality of NAND strings. Each of NAND strings may include memory cells respectively connected to word lines vertically stacked on a substrate. The disclosures of U.S. Pat. Nos. 7,679,133, 8,553,466, 8,654,587, and 8,559,235 and US Application Publication No. 2011/0233648 are incorporated by reference herein in their entireties. In various example embodiments, the memory cell array 1330 may include a 2-dimensional memory cell array, and the 2-dimensional memory cell array may include a plurality of NAND strings arranged in row and column directions.

The page buffer circuit 1340 may include n page buffers (n is an integer of 3 or more). The page buffer circuit 1340 may be connected to the memory cell array 1330 via the bit lines BL. The plurality of page buffers of the page buffer circuit 1340 may be respectively connected to the memory cells via the plurality of bit lines BL. The page buffer circuit 1340 may select at least one bit line among the bit lines BL in response to the column address Y-ADDR. The page buffer circuit 1340 may operate as a write driver or a sensing amplifier depending on an operation mode. For example, during a program operation, the page buffer circuit 1340 may apply a bit line voltage corresponding to data to be programmed via the selected bit line. During a read operation, the page buffer circuit 1340 may sense data stored in the memory cell by sensing the current or voltage of the selected bit line.

The voltage generator 1350 may generate various types of voltages to perform program, read, and erase operations on the basis of the voltage control signal CTRL_vol. For example, the voltage generator 1350 may generate a program voltage, a read voltage, a program verification voltage, an erase voltage, or the like as a word line voltage VWL.

For example, the voltage generator 1350 may adjust the slope of the program voltage. The voltage generator 1350 may adjust the slope of the program voltage applied to the selected word line during the program operation. The voltage generator 1350 may control a charging speed and a time at which the selected word line rises to a level of a program voltage VPGM. An increase in peak current may be reduced or prevented by controlling the slope of the voltage.

For example, the voltage generator 1350 may increase the program voltage from an initial voltage level to a target voltage level. The voltage generator 1350 may adjust the rising slope of the voltage on the basis of steps and cycles. For example, the voltage generator 1350 may reduce the rising slope of the voltage by increasing the cycle. Alternatively, the voltage generator 1350 may reduce the rising slope of the voltage by decreasing the step.

The row decoder 1360 may select one of the plurality of word lines WL in response to the row address X-ADDR and may select one of the plurality of string selection lines SSL. For example, the row decoder 1360 may apply a program voltage and a program verification voltage to the selected word line during a program operation and may apply a read voltage to the selected word line during a read operation.

The storage controller 1200 may transmit, to the non-volatile memory NVM, a chip enable signal/CE, a command latch enable signal CLE, an address latch enable signal ALE, a read enable signal/RE, and a write enable signal/WE. The storage controller 1200 and the non-volatile memory NVM may exchange a data signal DQ and a data strobe signal DQS.

TABLE 1

| /CE | CLE | ALE | /WE | /RE | DQS | MODE |
|---|---|---|---|---|---|---|
| L | H | L | ↑ | H | X | CMD Input |
| L | L | H | ↑ | H | X | ADDR Input |
| L | L | L | H | H | ↑↓ | Data Input |
| L | L | L | H | ↑↓ | ↑↓ | Data Output |

Table 1 shows examples of operation sections of the non-volatile memory NVM according to the state of each signal. Referring to Table 1, while the non-volatile memory NVM receives the command CMD or the address ADDR or inputs/outputs the data DATA, the chip enable signal/CE is maintained at a low level L. During a command input section CMD Input, the storage controller 1200 may control signal lines such that the command latch enable signal CLE has a high level H; the address latch enable signal ALE has a low level L; the write enable signal/WE toggles between a high level H and a low level L; and the read enable signal/RE has a high level H. During the command input section CMD Input, the storage controller 1200 may synchronize with a rising edge 1 of the write enable signal/WE and transmit the command CMD to the non-volatile memory NVM via the data lines DQ. The non-volatile memory NVM may identify the signal received via a data line DQ as the command CMD in response to the rising edge 1 of the write enable signal/WE.

During an address input section ADDR Input, the storage controller 1200 may control signal lines such that the command latch enable signal CLE has a low level L; the address latch enable signal ALE has a high level H; the write enable signal/WE toggles between a high level H and a low level L; and the read enable signal/RE has a high level H. During the address input section ADDR Input, the storage controller 1200 may synchronize with a rising edge ↑ of the write enable signal/WE and transmit the address ADDR to the non-volatile memory NVM via the data lines DQ. The non-volatile memory NVM may identify the signal received via a data line DQ as the address ADDR in response to the rising edge ↑ of the write enable signal/WE.

During a data input section Data Input, the storage controller 1200 may control signal lines such that the command latch enable signal CLE has a low level L; the address latch enable signal ALE has a low level L; the write enable signal/WE has a high level H; the read enable signal/RE has a high level H; and the data strobe signal DQS toggles between a high level H and a low level L. During the data input section Data Input, the storage controller 1200 may synchronize with the rising edge ↑ and the falling edge ↓ of the data strobe signal DQS and may transmit the data DATA to the non-volatile memory NVM via the data line DQ. The non-volatile memory NVM may identify the signal received via the data line DQ as the data DATA in response to the rising edge ↑ and the falling edge ↓ of the data strobe signal DQS.

During a data output section Data Output, the storage controller 1200 may control signal lines such that the command latch enable signal CLE has a low level L; the address latch enable signal ALE has a low level L; the write enable signal/WE has a high level H; and the read enable signal/RE toggles between a high level H and a low level L. During the data output section Data Output, the non-volatile memory NVM may generate the data strobe signal DQS, which toggles between the high level H and the low level L, in response to the read enable signal/RE. The non-volatile memory NVM may synchronize with the rising edge 1 and the falling edge ↓ of the data strobe signal DQS and transmit the data DATA to the storage controller 1200 via the data lines DQ. The storage controller 1200 may identify the signal received via the data lines DQ as the data DATA in response to the rising edge ↑ and the falling edge ↓ of the data strobe signal DQS. The toggle interface described above is only an example, and the scope of the inventive concepts are not limited thereto.

In various example embodiments, the non-volatile memory NVM may perform the normal program operation and the slow program operation. The non-volatile memory NVM may perform a program during the first program time tPROG1 in response to the normal program command. The non-volatile memory NVM may perform a program during the second program time tPROG2 in response to the slow program command. The non-volatile memory NVM may perform program operations having different program times.

As described above, the non-volatile memory NVM according to various example embodiments may include the memory cell array 1330 that includes the plurality of memory cells, the row decoder 1360 that is connected to the memory cells via the word line and applies the program voltage and the verification voltage to the word line during the program operation, the page buffer circuit 1340 that is connected to the memory cell array via the bit line and applies the bit line voltage corresponding to data to be programmed via the selected bit line, the input/output circuit 1310 that receives the data or commands from the outside via the data lines and transmits the data to the page buffer circuit 1340, and the control logic circuit 1320 that outputs the ready/busy signal in the busy state during the first program time tPROG1 in response to the normal program command received via the input/output circuit 1310 and outputs the ready/busy signal in the busy state during the second program time tPROG2 in response to the slow program command received via the input/output circuit 1310. The second program time tPROG2 may be longer than the first program time tPROG1.

Figure 4:
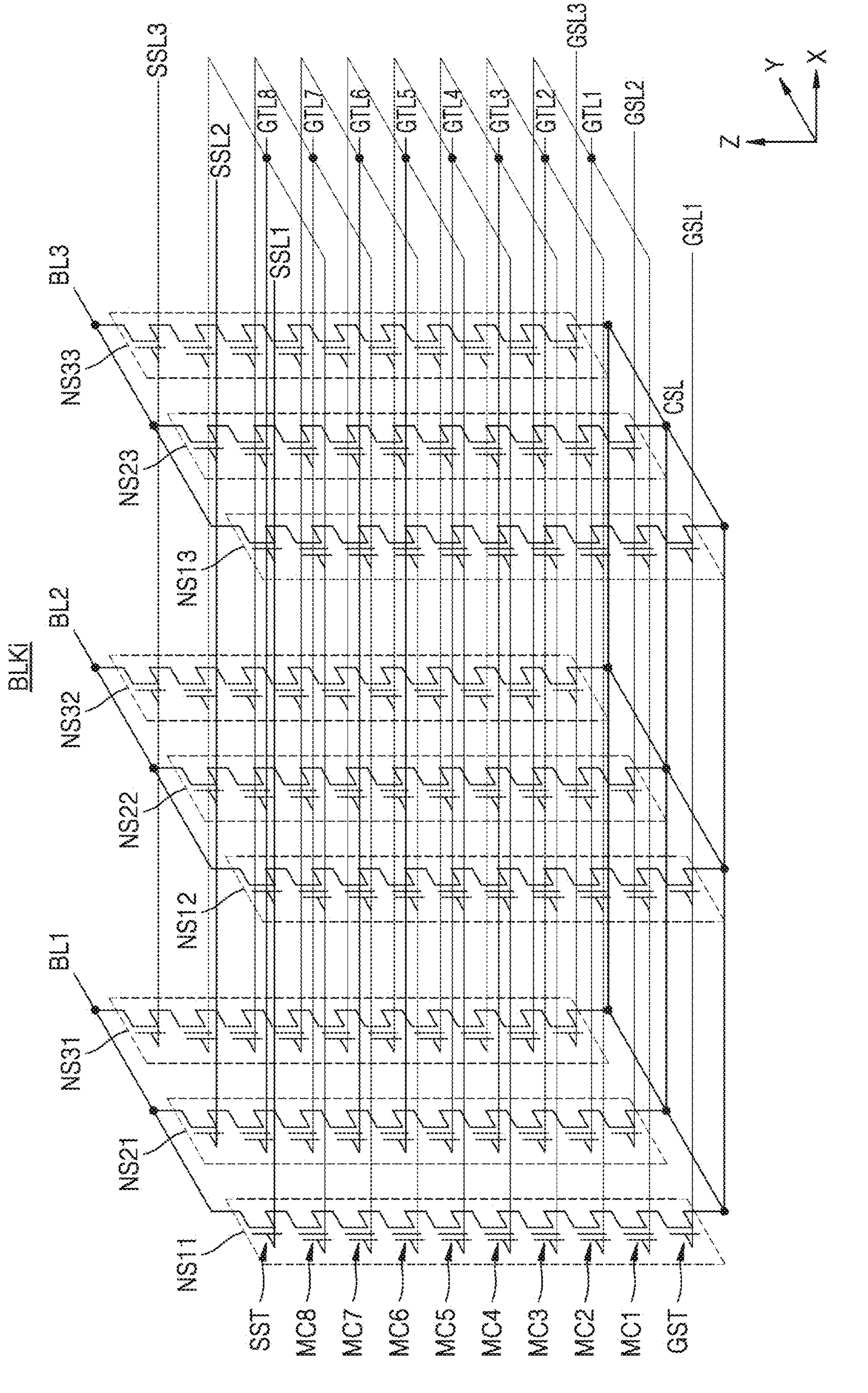
FIG. 4 is a block diagram showing an example of a memory block of FIG. 3.

FIG. 4 is a block diagram showing an example of a memory block BLKi of FIG. 3.

Referring to FIG. 4, the memory block BLKi represents a three-dimensional memory block formed in a three-dimensional structure on a substrate. For example, a plurality of memory NAND strings of the memory block BLKi may be formed in a direction perpendicular to the substrate.

Referring to FIG. 4, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1, MC2, . . . , and MC8, and a ground selection transistor GST. FIG. 4 shows that each of the plurality of memory NAND strings NS11 to NS33 includes eight memory cells MC1, MC2, . . . , and MC8, but various example embodiments are not limited thereto.

The string selection transistors SST may be connected to corresponding string selection lines SSL1, SSL2, and SSL3. The plurality of memory cells MC1, MC2, . . . , and MC8 may be respectively connected to corresponding gate lines GTL1, GTL2, . . . , and GTL8. The gate lines GTL1, GTL2, . . . , and GTL8 may correspond to word lines, and some of the gate lines GTL1, GTL2, . . . , and GTL8 may correspond to dummy word lines. The ground selection transistors GST may be connected to corresponding ground selection lines GSL1, GSL2, and GSL3. The string selection transistors SST may be connected to corresponding bit lines BL1, BL2, and BL3, and the ground selection transistors GST may be connected to the common source line CSL.

The word lines (e.g., WL1) located at the same height may be connected in common, and the ground selection lines GSL1, GSL2, and GSL3 and the string selection lines SSL1, SSL2, and SSL3 may be separated from each other. FIG. 4 illustrates that the memory block BLKi is connected to the eight gate lines GTL1, GTL2, . . . , and GTL8 and the three bit lines BL1, BL2, and BL3, but various example embodiments are not limited thereto.

Figure 5A:
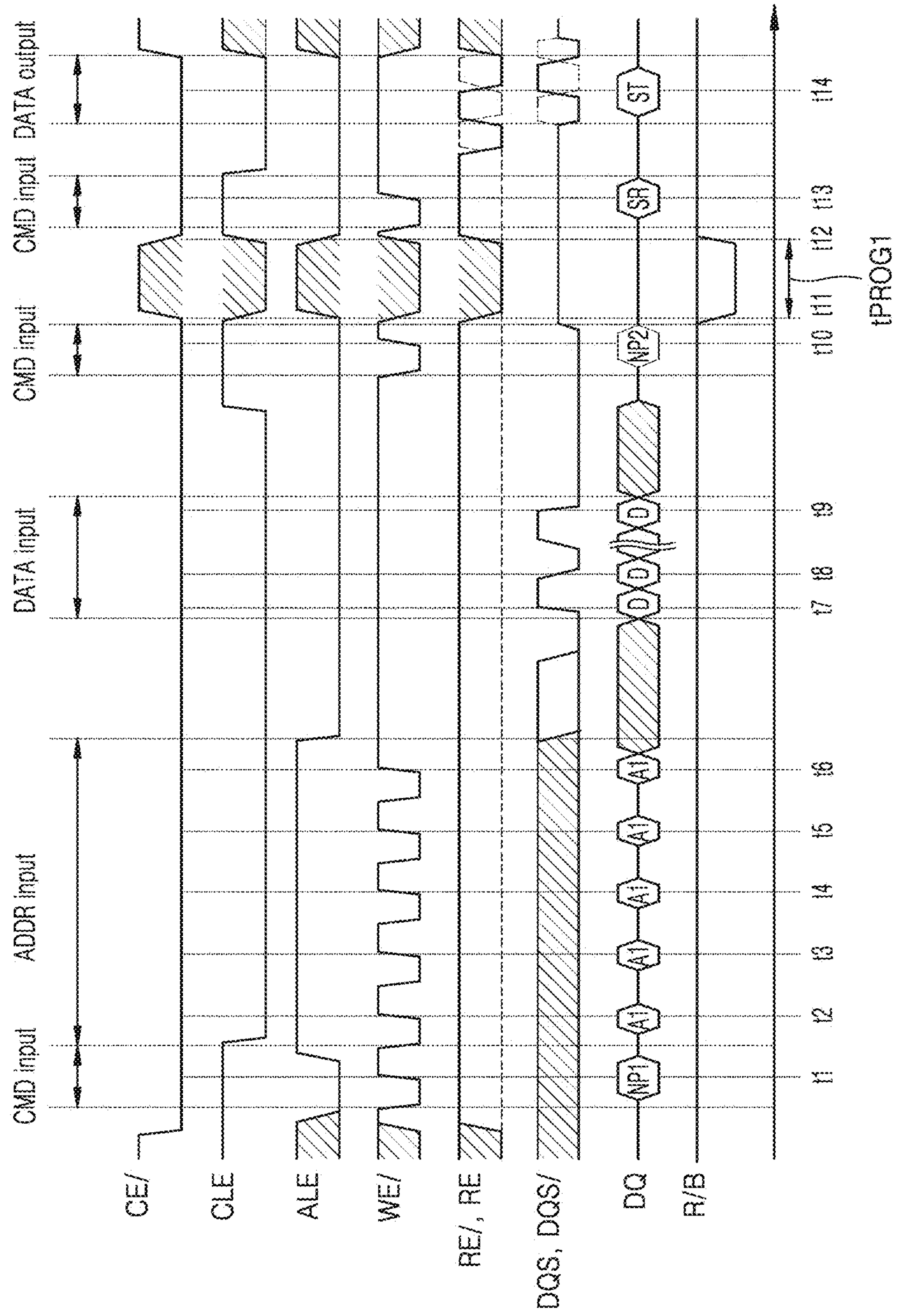
FIGS. 5A and 5B are timing charts showing operations of the non-volatile memory.
Figure 5B:
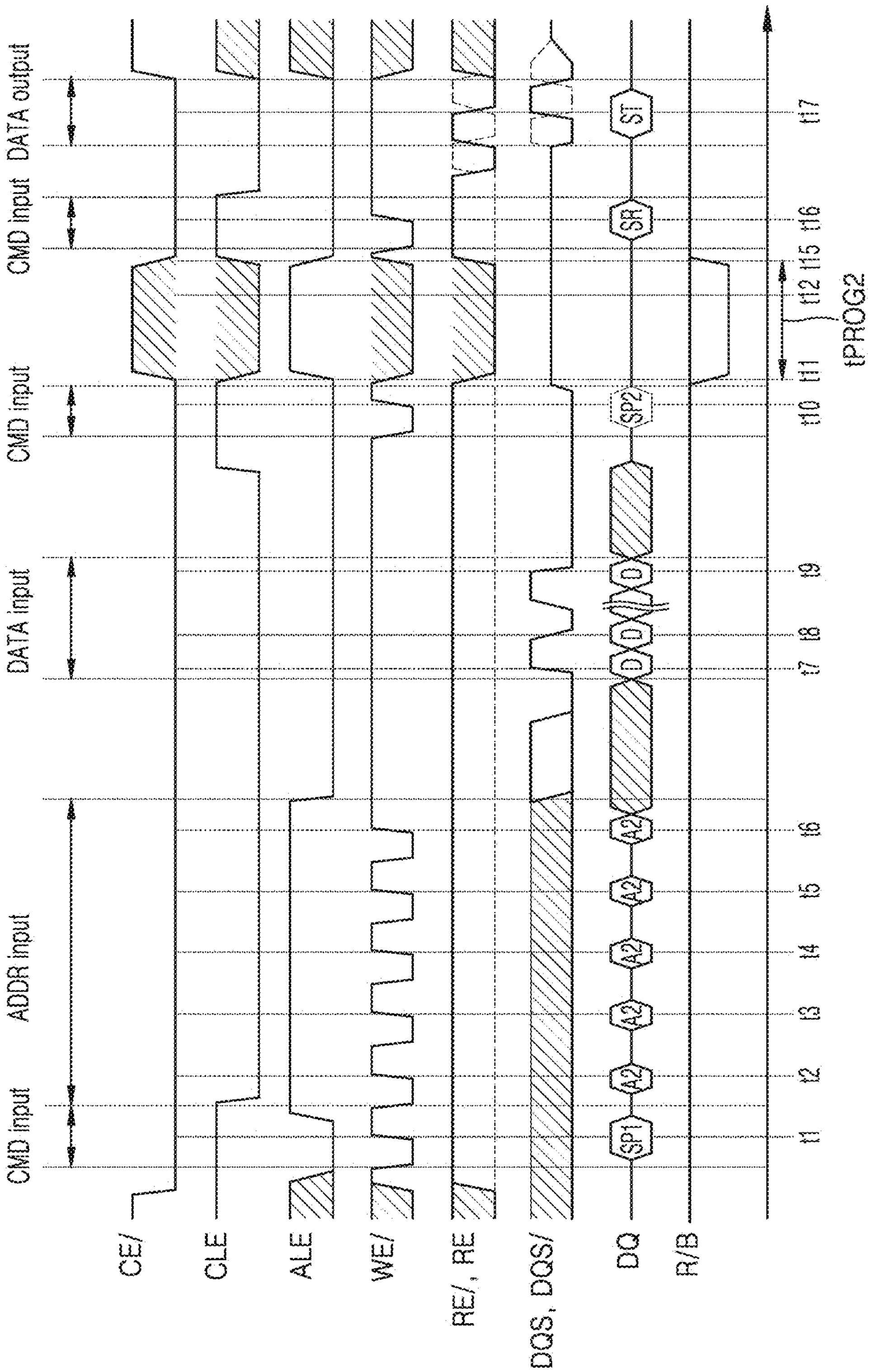

FIGS. 5A and 5B are timing charts showing operations of the non-volatile memory.

The normal program operation is described with reference to FIG. 5A and the slow program operation is described with reference to FIG. 5B. Referring to FIGS. 1 and 5A, the storage device 1100 may perform the normal program operation. The storage controller 1200 may transmit the normal program command to the non-volatile memory NVM. The non-volatile memory NVM may output a ready/busy signal R/B in a busy state during the first program time tPROG1 in response to the normal program command.

The non-volatile memory NVM may receive a first normal program command NP1 during the command input section CMD Input. For example, at a first point of time t1, the non-volatile memory NVM may latch the signal received via the data lines DQ as the first normal program command NP1 in synchronization with the rising edge of a write enable signal WE/.

The non-volatile memory NVM may receive an address A1 during the address input section ADDR input. For example, at second to sixth points of time t2 to t6, the non-volatile memory NVM may latch the signal received via the data lines DQ as the address A1 in synchronization with the rising edge of the write enable signal WE/.

The non-volatile memory NVM may receive data D during the data input section Data Input. For example, at seventh to ninth points of time t7 to t9, the non-volatile memory NVM may latch the signal received via the data lines DQ as the data D in synchronization with the rising edge and the falling edge of the data strobe signal DQS.

The non-volatile memory NVM may receive a second normal program command NP2 during the command input section CMD Input. For example, at a tenth point of time t10, the non-volatile memory NVM may latch the signal received via the data lines DQ as the second normal program command NP2 in synchronization with the rising edge of the write enable signal WE/.

The first and second general program commands NP1 and NP2 may include a command set for a page program operation (e.g., 80 h and 10 h). For example, the addresses A1 may be received for several cycles (e.g., 5 cycles) of the write enable signal WE/. However, the range of the inventive concepts are not limited thereto. The addresses A1 may represent a row address or a column address for a physical page that represents a page in which data is to be stored.

The non-volatile memory NVM may program the received data D into a region of the memory cell array 1330 corresponding to the received addresses A1 in response to the second normal program command NP2. The non-volatile memory NVM may perform the normal program operation (i.e., the first program operation) during the first program time tPROG1. The non-volatile memory NVM may output the ready/busy signal R/B in the busy state (or the logic low) to the storage controller 1200 during the first program time tPROG1.

In various example embodiments, the storage device 1100 may perform a status read operation after performing the normal program operation. The non-volatile memory NVM may receive a status read command SR during the command input section CMD Input. For example, at a 13th point of time t13, the non-volatile memory NVM may latch the signal received via the data lines DQ as the status read command SR in synchronization with the rising edge of the write enable signal WE/.

The non-volatile memory NVM may output a status ST during the data output section Data Output. For example, the non-volatile memory NVM may generate the data strobe signal DQS in response to a read enable signal RE/from the storage controller 1200 and may output the status ST via the data line DQ in synchronization with the generated data strobe signal DQS. At a 14th point of time t14, the non-volatile memory NVM may output the status ST via the data line DQ in synchronization with the rising edge or falling edge of the data strobe signal DQS.

Referring to FIGS. 1 and 5B, the storage device 1100 may perform the slow program operation. The storage controller 1200 may transmit the slow program command to the non-volatile memory NVM. The non-volatile memory NVM may output a ready/busy signal R/B in a busy state during the second program time tPROG2 in response to the slow program command. That is, the ready/busy signal R/B may be in logic low from an 11th point of time t11 to a 15th point of time t15.

The non-volatile memory NVM may receive a first slow program command SP1 during the command input section CMD Input. For example, at a first point of time t1, the non-volatile memory NVM may latch the signal received via the data lines DQ as the first slow program command SP1 in synchronization with the rising edge of a write enable signal WE/.

The non-volatile memory NVM may receive an address A2 during the address input section ADDR input. For example, at second to sixth points of time t2 to t6, the non-volatile memory NVM may latch the signal received via the data lines DQ as the address A2 in synchronization with the rising edge of the write enable signal WE/.

The non-volatile memory NVM may receive data D during the data input section Data Input. For example, at seventh to ninth points of time t7 to t9, the non-volatile memory NVM may latch the signal received via the data lines DQ as the data D in synchronization with the rising edge and the falling edge of the data strobe signal DQS.

The non-volatile memory NVM may receive a second slow program command SP2 during the command input section CMD Input. For example, at a tenth point of time t10, the non-volatile memory NVM may latch the signal received via the data lines DQ as the second slow program command SP2 in synchronization with the rising edge of the write enable signal WE/.

The first and second slow program commands SP1 and SP2 may include a command set for slow program operations. For example, the addresses A2 may be received for several cycles (e.g., 5 cycles) of the write enable signal WE/. However, the range of the inventive concepts are not limited thereto. The addresses A2 may represent a row address or a column address for a physical page that represents a page in which data is to be stored.

The non-volatile memory NVM may program the received data D into a region of the memory cell array 1330 corresponding to the received addresses A2 in response to the second slow program command SP2. The non-volatile memory NVM may perform the slow program operation (i.e., the second program operation) during the second program time tPROG2. The non-volatile memory NVM may output the ready/busy signal R/B in the busy state (or the logic low) to the storage controller 1200 during the second program time tPROG2. That is, the ready/busy signal R/B may be in logic low from an 11th point of time t11 to a 15th point of time t15.

In various example embodiments, the storage device 1100 may perform a status read operation after performing the slow program operation. The non-volatile memory NVM may receive a status read command SR during the command input section CMD Input. For example, at a 16th point of time t16, the non-volatile memory NVM may latch the signal received via the data lines DQ as the status read command SR in synchronization with the rising edge of the write enable signal WE/.

The non-volatile memory NVM may output a status ST during the data output section Data Output. For example, the non-volatile memory NVM may generate the data strobe signal DQS in response to a read enable signal RE/from the storage controller 1200 and may output the status ST via the data line DQ in synchronization with the generated data strobe signal DQS. At a 17th point of time t17, the non-volatile memory NVM may output the status ST via the data line DQ in synchronization with the rising edge or falling edge of the data strobe signal DQS.

As described above, the non-volatile memory NVM may support both the normal program operation and the slow program operation. The non-volatile memories of the non-volatile memory device 1300 may completely perform a plurality of program operations having different amounts of current consumption. The non-volatile memory NVM may improve the performance by supporting all program operations having different program times.

Figure 6:
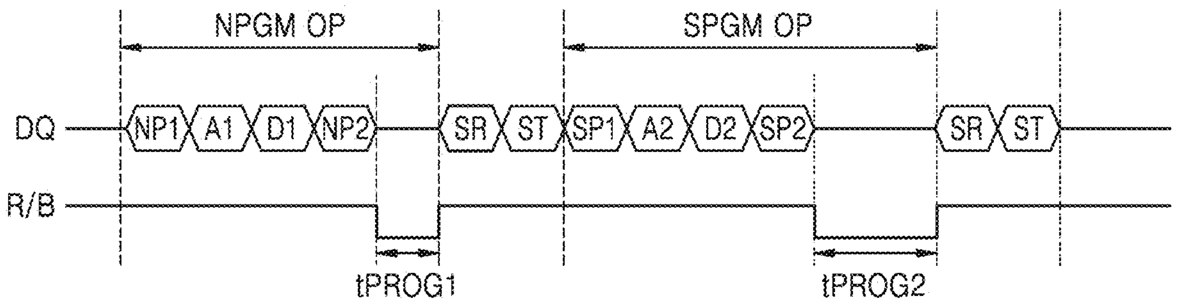
FIG. 6 is a timing chart showing an example of an operation of a storage controller of FIG. 1.

FIG. 6 is a timing chart showing an example of an operation of a storage controller 1200 of FIG. 1.

Referring to FIGS. 1 and 6, the storage controller 1200 may perform the normal program operation and the slow program operation. For example, the storage controller 1200 may perform a normal program operation NPGM OP. The storage controller 1200 may perform a status read operation after performing the normal program operation NPGM OP. The storage controller 1200 may transmit the first normal program command NP1 during the command input section CMD Input. Subsequently, the storage controller 1200 may transmit a first address A1 during the address input section ADDR Input.

Subsequently, the storage controller 1200 may transmit first data D1 during the data input section Data Input. Subsequently, the storage controller 1200 may transmit the second normal program command NP2 during the command input section CMD Input. The non-volatile memory NVM may store the first data D1 received during the first program time tPROG1 in a region corresponding to the first address A1 in response to the second normal program command NP2. The storage controller 1200 may receive the ready/busy signal R/B in the busy state during the first program time tPROG1.

Subsequently, the storage controller 1200 may perform the status read operation. The storage controller 1200 may transmit a status read command during the command input section CMD input. Subsequently, the storage controller 1200 may receive and read the status during the data output section Data Output.

The storage controller 1200 may perform a slow program operation SPGM OP. The storage controller 1200 may perform a status read operation after performing the slow program operation SPGM OP. The storage controller 1200 may transmit the first slow program command SP1 during the command input section CMD Input. Subsequently, the storage controller 1200 may transmit a second address A2 during the address input section ADDR Input.

Subsequently, the storage controller 1200 may transmit second data D2 during the data input section Data Input. Subsequently, the storage controller 1200 may transmit the second slow program command SP2 during the command input section CMD Input. The non-volatile memory NVM may store the second data D2 received during the second program time tPROG2 in a region corresponding to the second address A2 in response to the second slow program command SP2. The storage controller 1200 may receive the ready/busy signal R/B in the busy state during the second program time tPROG2.

Subsequently, the storage controller 1200 may perform the status read operation. The storage controller 1200 may transmit a status read command during the command input section CMD input. Subsequently, the storage controller 1200 may receive and read the status during the data output section Data Output.

As described above, the storage device 1100 may perform the slow program operation when the allowable current is insufficient. As the storage device 1100 performs the slow program operation using less current and may promptly perform the program command transmission that has been blocked due to peak current. Accordingly, the storage device with improved performance is provided.

Figure 7A:
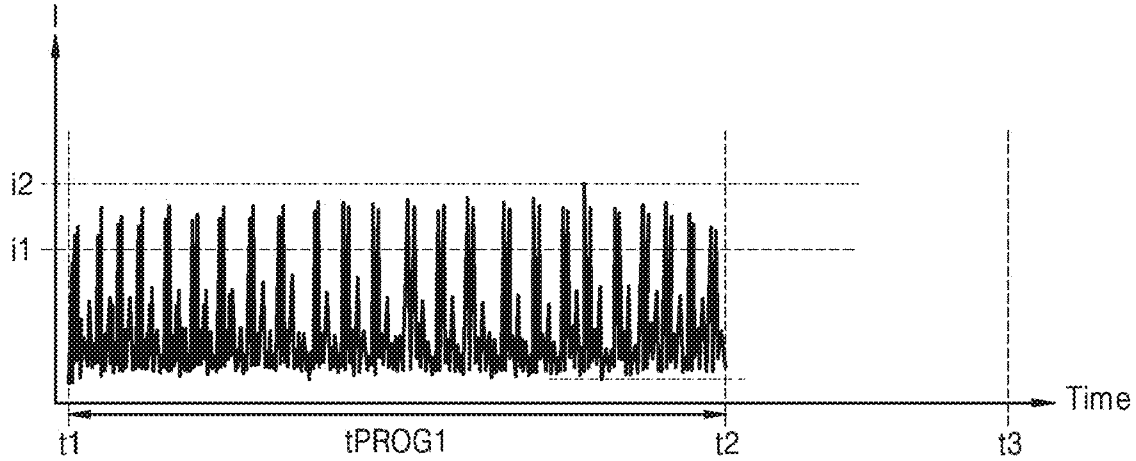
FIGS. 7A and 7B are graphs showing examples of peak currents.
Figure 7B:
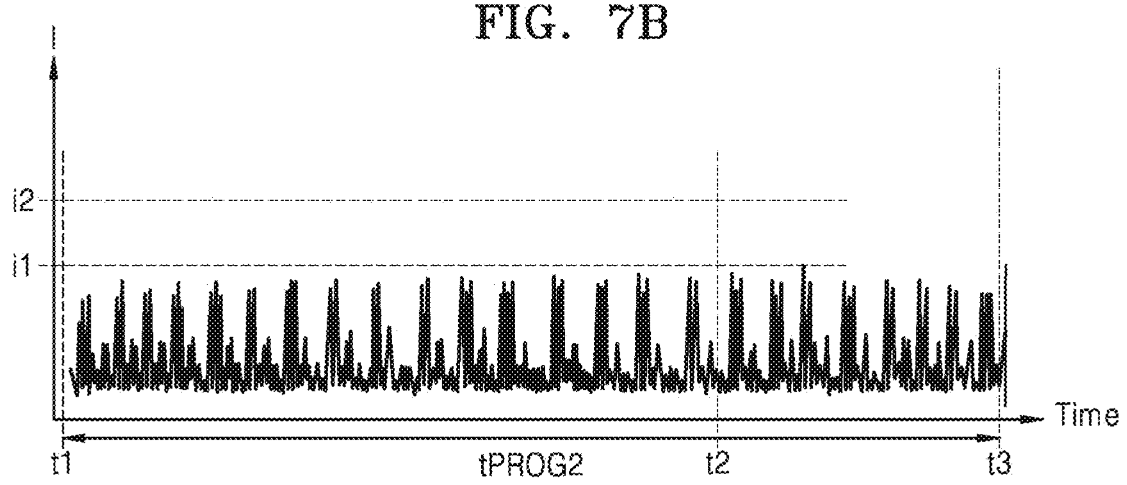

FIGS. 7A and 7B are graphs showing examples of peak currents.

FIG. 7A shows the current according to the normal program operation and FIG. 7B shows the current according to the slow program operation. The horizontal axis of the graph in FIG. 7A represents time, and the vertical axis thereof represents the amount of current. The horizontal axis of the graph in FIG. 7B represents time, and the vertical axis thereof represents the amount of current.

Referring to FIG. 7A, the non-volatile memory NVM may perform the normal program operation. The non-volatile memory NVM may perform the normal program operation from a first point of time t1 to a second point of time t2. That is, the non-volatile memory NVM may perform the normal program operation during the first program time tPROG1. While performing the normal program operation, the peak current may have a second current value i2.

Referring to FIG. 7B, the non-volatile memory NVM may perform the slow program operation. The non-volatile memory NVM may perform the slow program operation from a first point of time t1 to a third point of time t3. That is, the non-volatile memory NVM may perform the slow program operation during the second program time tPROG2. While performing the slow program operation, the peak current may have a first current value i1.

As the slow program operation is performed, the peak current may decrease from the second current value i2 to the first current value i1. That is, the peak current may be reduced by performing the slow program operation. In terms of peak current, a gain as much as (i2-i1) may be obtained by performing the slow program operation. However, as the slow program operation is performed, the program time may increase. Compared to the normal program operation, the program time of the slow program operation may increase from the first program time tPROG1 to the second program time tPROG2. In terms of program time, a loss as much as (t3-t2) may occur by performing the slow program operation.

Figure 8A:
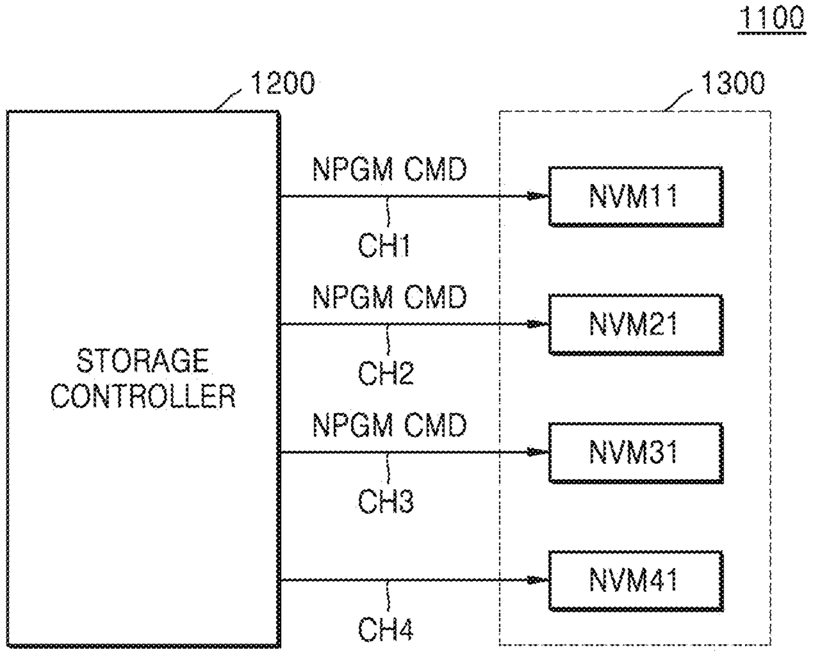
FIGS. 8A and 8B are diagrams showing an example of an operation of the storage device of FIG. 1.
Figure 8B:
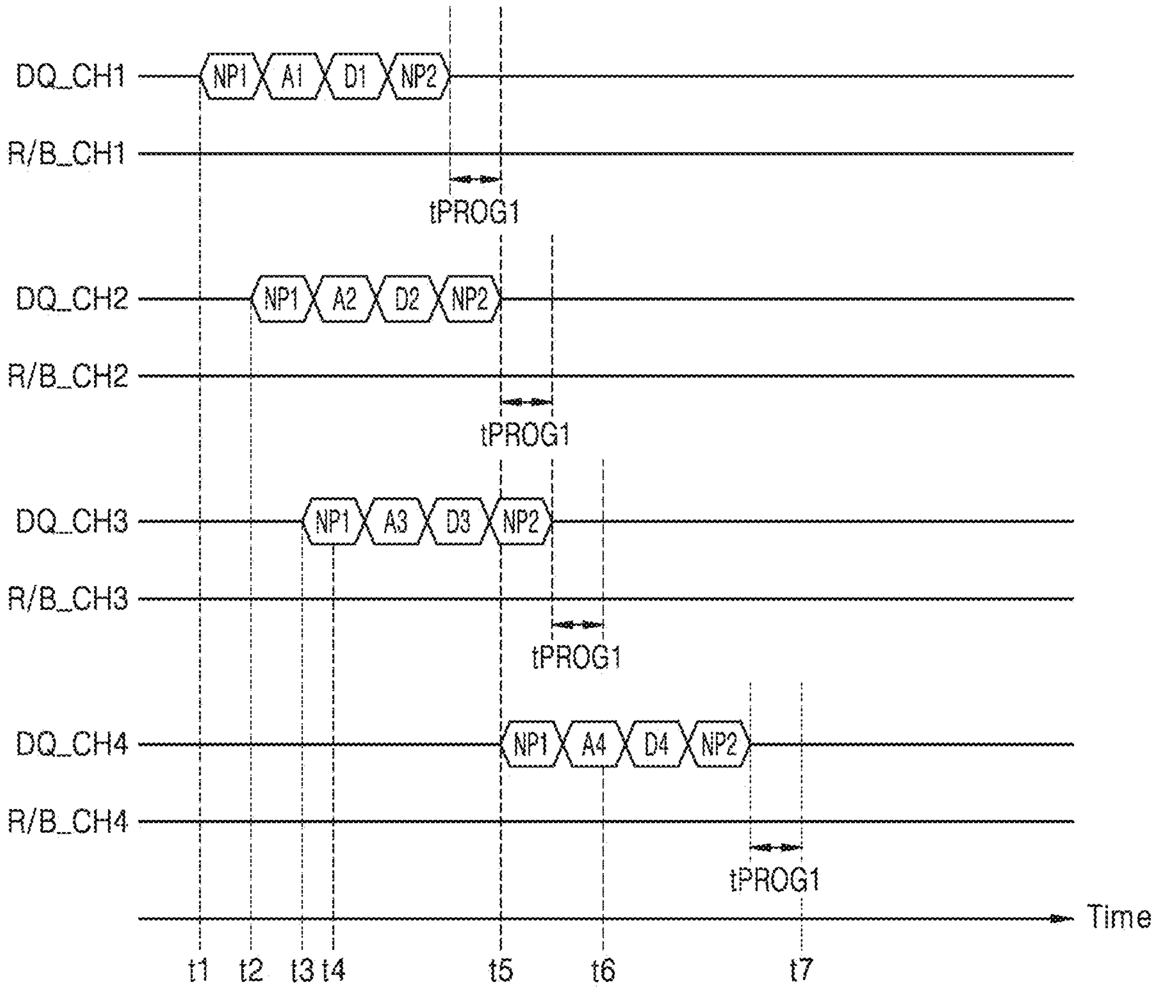

FIGS. 8A and 8B are diagrams showing an example of an operation of the storage device 1100 of FIG. 1.

Referring to FIGS. 1, 8A, and 8B, the storage controller 1200 may be connected to a first non-volatile memory NVM11 via a first channel CH1. The storage controller 1200 may be connected to a second non-volatile memory NVM21 via a second channel CH2. The storage controller 1200 may be connected to a third non-volatile memory NVM31 via a third channel CH3. The storage controller 1200 may be connected to a fourth non-volatile memory NVM41 via a fourth channel CH4.

The storage controller 1200 may transmit a first normal program command NPGM CMD (or simply referred to as a normal program command NPGM CMD) to the first non-volatile memory NVM11. The storage controller 1200 may transmit a second normal program command NPGM CMD (or simply referred to as a normal program command NPGM CMD) to the second non-volatile memory NVM21. The storage controller 1200 may transmit a third normal program command NPGM CMD (or simply referred to as a normal program command NPGM CMD) to the third non-volatile memory NVM31. The storage controller 1200 tries to transmit a fourth normal program command to the fourth non-volatile memory NVM41, but may not transmit the fourth normal program command to the fourth non-volatile memory NVM41.

The storage controller 1200 may perform operations through an interleaving method. The storage controller 1200 may simultaneously or sequentially transmit the first normal program command NPGM CMD, the second normal program command NPGM CMD, and the third normal program command NPGM CMD. The normal program operation of the first non-volatile memory NVM11, the normal program operation of the second non-volatile memory NVM21, and the normal program operation of the third non-volatile memory NVM31 may be performed simultaneously. That is, the normal program operation of the first non-volatile memory NVM11, the normal program operation of the second non-volatile memory NVM21, and the normal program operation of the third non-volatile memory NVM31 may be performed in parallel.

The storage controller 1200 may transmit the normal program command NPGM CMD to the first non-volatile memory NVM11 at a first point of time t1. The storage controller 1200 may transmit a first normal program command NP1 to the first non-volatile memory NVM11 via data lines DQ_CH1 of the first channel CH1 at the first point of time t1. The storage controller 1200 may transmit a first address A1 to the first non-volatile memory NVM11 via the data lines DQ_CH1 of the first channel CH1. The storage controller 1200 may transmit first data D1 to the first non-volatile memory NVM11 via the data lines DQ_CH1 of the first channel CH1. The storage controller 1200 may transmit a second normal program command NP2 to the first non-volatile memory NVM11 via the data lines DQ_CH1 of the first channel CH1. The first non-volatile memory NVM11 may program the first data D1 to the first address A1 during the first program time tPROG1. The first non-volatile memory NVM11 may output a ready/busy signal R/B in the busy state via a ready/busy line R/B_CH1 of the first channel CH1 during the first program time tPROG1. The first non-volatile memory NVM11 may complete the program operation at a fifth point of time t5.

The storage controller 1200 may transmit the normal program command NPGM CMD to the second non-volatile memory NVM21 at a second point of time t2. The storage controller 1200 may transmit a first normal program command NP1 to the second non-volatile memory NVM21 via data lines DQ_CH2 of the second channel CH2 at the second point of time t2. The storage controller 1200 may transmit a second address A2 to the second non-volatile memory NVM21 via the data lines DQ_CH2 of the second channel CH2. The storage controller 1200 may transmit second data D2 to the second non-volatile memory NVM21 via the data lines DQ_CH2 of the second channel CH2. The storage controller 1200 may transmit a second normal program command NP2 to the second non-volatile memory NVM21 via the data lines DQ_CH2 of the second channel CH2. The second non-volatile memory NVM21 may program the second data D2 to the second address A2 during the first program time tPROG1. The second non-volatile memory NVM21 may output a ready/busy signal R/B in the busy state via a ready/busy line R/B_CH2 of the second channel CH2 during the first program time tPROG1.

The storage controller 1200 may transmit the normal program command NPGM CMD to the third non-volatile memory NVM31 at a third point of time t3. The storage controller 1200 may transmit a first normal program command NP1 to the third non-volatile memory NVM31 via data lines DQ_CH3 of the third channel CH3 at the third point of time t3. The storage controller 1200 may transmit a third address A3 to the third non-volatile memory NVM31 via the data lines DQ_CH3 of the third channel CH3. The storage controller 1200 may transmit third data D3 to the third non-volatile memory NVM31 via the data lines DQ_CH3 of the third channel CH3. The storage controller 1200 may transmit a second normal program command NP2 to the third non-volatile memory NVM31 via the data lines DQ_CH3 of the third channel CH3. The third non-volatile memory NVM31 may program the third data D3 to the third address A3 during the first program time tPROG1. The third non-volatile memory NVM31 may output a ready/busy signal R/B in the busy state via a ready/busy line R/B_CH3 of the third channel CH3 during the first program time tPROG1.

The storage controller 1200 may not transmit a normal program command to the fourth non-volatile memory NVM41 at a fourth point of time t4. If a program operation is performed in the fourth non-volatile memory NVM41, the peak current thereof exceeds the allowable current of the storage device 1100. Accordingly, the storage controller 1200 may block transmission of a normal program command to the fourth non-volatile memory NVM41. The storage controller 1200 may delay transmission of the normal program command until a program operation of another non-volatile memory is completed.

The storage controller 1200 may transmit the normal program command NPGM CMD to the fourth non-volatile memory NVM41 at a fifth point of time t5. Since the normal program operation of the first non-volatile memory NVM11 has been completed, the storage controller 1200 may transmit the normal program command to the fourth non-volatile memory NVM41.

The storage controller 1200 may transmit the normal program command NPGM CMD to the fourth non-volatile memory NVM41 at the fifth point of time t5. The storage controller 1200 may transmit a first normal program command NP1 to the fourth non-volatile memory NVM41 via data lines DQ_CH4 of the fourth channel CH4 at the fifth point of time t5. The storage controller 1200 may transmit a fourth address A4 to the fourth non-volatile memory NVM41 via the data lines DQ_CH4 of the fourth channel CH4. The storage controller 1200 may transmit fourth data D4 to the fourth non-volatile memory NVM41 via the data lines DQ_CH4 of the fourth channel CH4. The storage controller 1200 may transmit a second normal program command NP2 to the fourth non-volatile memory NVM41 via the data lines DQ_CH4 of the fourth channel CH4. The fourth non-volatile memory NVM41 may program the fourth data D4 to the fourth address A4 during the first program time tPROG1. The fourth non-volatile memory NVM41 may output a ready/busy signal R/B in the busy state via a ready/busy line R/B_CH4 of the fourth channel CH4 during the first program time tPROG1. The fourth non-volatile memory NVM41 may complete the normal program operation at a seventh point of time t7.

As described above, the storage device 1100 may delay performing the normal program operation of the fourth non-volatile memory NVM41 so as to reduce or prevent the total peak current from exceeding the allowable current. That is, the storage controller 1200 may block transmission of the normal program command to the fourth non-volatile memory NVM41. The storage controller 1200 may block transmission of the program command until the program operation of another non-volatile memory (e.g., the first non-volatile memory NVM11) is completed.

Figure 9A:
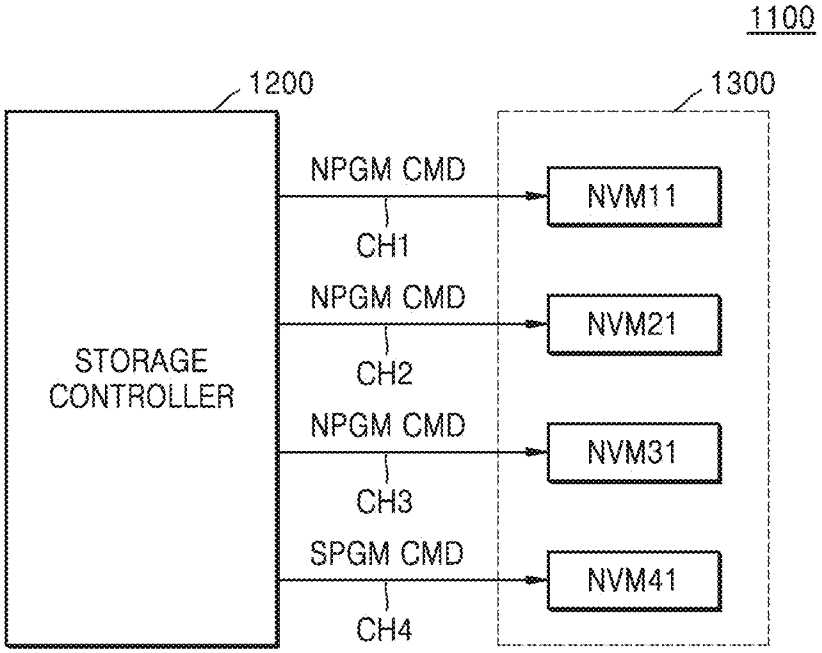
FIGS. 9A and 9B are diagrams showing an example of an operation of the storage device of FIG. 1.
Figure 9B:
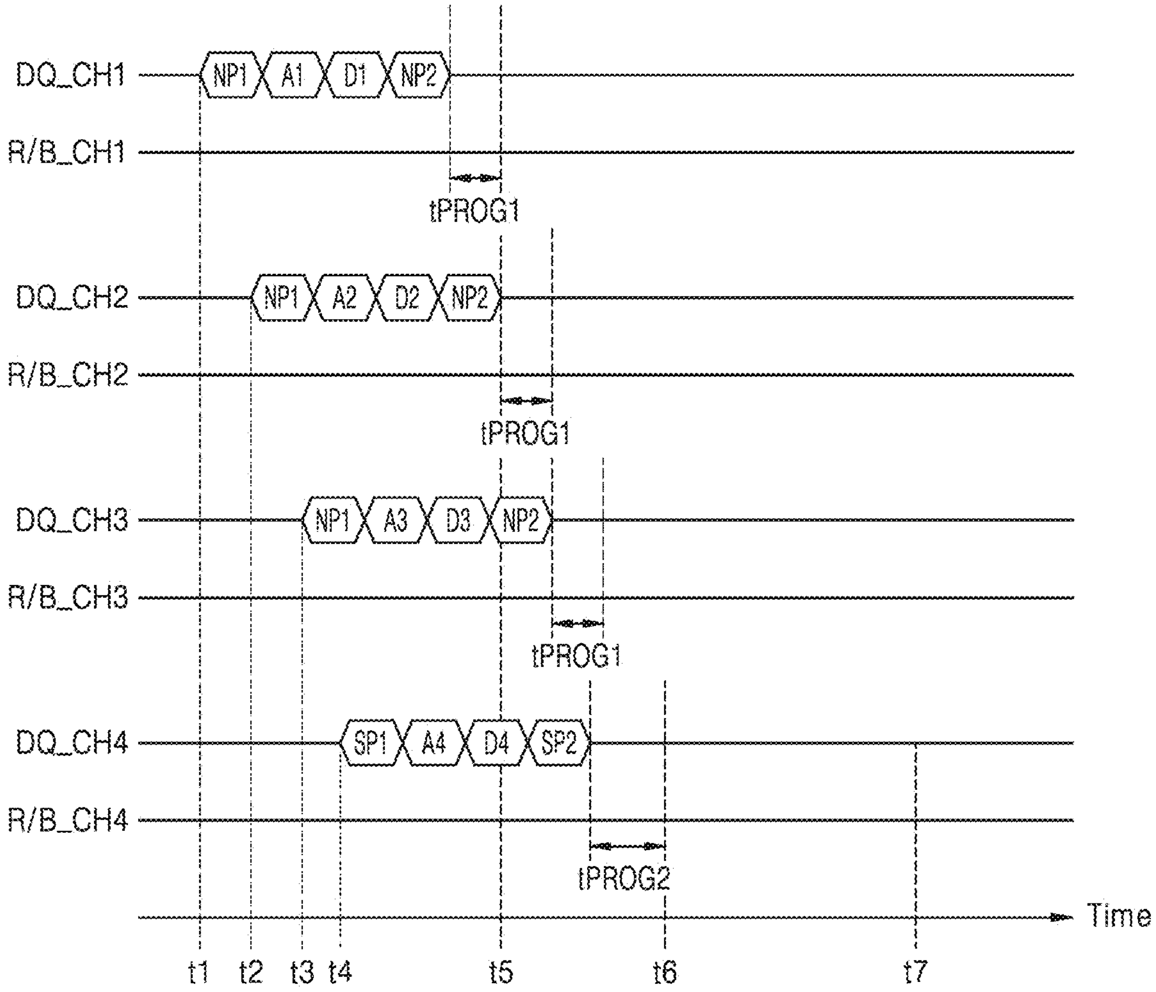

FIGS. 9A and 9B are diagrams showing an example of an operation of the storage device 1100 of FIG. 1.

Referring to FIGS. 1, 9A, and 9B, the storage controller 1200 may be connected to a first non-volatile memory NVM11 via a first channel CH1. The storage controller 1200 may be connected to a second non-volatile memory NVM21 via a second channel CH2. The storage controller 1200 may be connected to a third non-volatile memory NVM31 via a third channel CH3. The storage controller 1200 may be connected to a fourth non-volatile memory NVM41 via a fourth channel CH4.

The storage controller 1200 may transmit either a normal program command or a slow program command to a non-volatile memory NVM via data lines. The non-volatile memory NVM may output a ready/busy signal R/B in a busy state to the storage controller 1200 during a first program time tPROG1 in response to a normal program command NPGM CMD and may output a ready/busy signal R/B in a busy state to the storage controller 1200 during a second program time tPROG2, which is different from the first program time tPROG1, in response to a slow program command SPGM CMD.

The storage controller 1200 may transmit a first normal program command NPGM CMD (or simply referred to as a normal program command NPGM CMD) to the first non-volatile memory NVM11. The storage controller 1200 may transmit a second normal program command NPGM CMD (or simply referred to as a normal program command NPGM CMD) to the second non-volatile memory NVM21. The storage controller 1200 may transmit a third normal program command NPGM CMD (or simply referred to as a normal program command NPGM CMD) to the third non-volatile memory NVM31. The storage controller 1200 may transmit the slow program command SPGM CMD to the fourth non-volatile memory NVM41.

The storage controller 1200 may perform operations through an interleaving method. The storage controller 1200 may simultaneously or sequentially transmit the first normal program command NPGM CMD, the second normal program command NPGM CMD, the third normal program command NPGM CMD, and the slow program command SPGM CMD. The normal program operation of the first non-volatile memory NVM11, the normal program operation of the second non-volatile memory NVM21, the normal program operation of the third non-volatile memory NVM31, and the slow program operation of the fourth non-volatile memory NVM41 may be performed simultaneously. The normal program operation of the first non-volatile memory NVM11, the normal program operation of the second non-volatile memory NVM21, the normal program operation of the third non-volatile memory NVM31, and the slow program operation of the fourth non-volatile memory NVM41 may be performed in parallel.

The storage controller 1200 may transmit the normal program command NPGM CMD to the first non-volatile memory NVM11 at a first point of time t1. The storage controller 1200 may transmit a first normal program command NP1 to the first non-volatile memory NVM11 via data lines DQ_CH1 of the first channel CH1 at the first point of time t1. The storage controller 1200 may transmit a first address A1 to the first non-volatile memory NVM11 via the data lines DQ_CH1 of the first channel CH1. The storage controller 1200 may transmit first data D1 to the first non-volatile memory NVM11 via the data lines DQ_CH1 of the first channel CH1. The storage controller 1200 may transmit a second normal program command NP2 to the first non-volatile memory NVM11 via the data lines DQ_CH1 of the first channel CH1. The first non-volatile memory NVM11 may program the first data D1 to the first address A1 during the first program time tPROG1. The first non-volatile memory NVM11 may output a ready/busy signal R/B in the busy state via a ready/busy line R/B_CH1 of the first channel CH1 during the first program time tPROG1. The first non-volatile memory NVM11 may complete the program operation at a fifth point of time t5.

The storage controller 1200 may transmit the normal program command NPGM CMD to the second non-volatile memory NVM21 at a second point of time t2. The storage controller 1200 may transmit a first normal program command NP1 to the second non-volatile memory NVM21 via data lines DQ_CH2 of the second channel CH2 at the second point of time t2. The storage controller 1200 may transmit a second address A2 to the second non-volatile memory NVM21 via the data lines DQ_CH2 of the second channel CH2. The storage controller 1200 may transmit second data D2 to the second non-volatile memory NVM21 via the data lines DQ_CH2 of the second channel CH2. The storage controller 1200 may transmit a second normal program command NP2 to the second non-volatile memory NVM21 via the data lines DQ_CH2 of the second channel CH2. The second non-volatile memory NVM21 may program the second data D2 to the second address A2 during the first program time tPROG1. The second non-volatile memory NVM21 may output a ready/busy signal R/B in the busy state via a ready/busy line R/B_CH2 of the second channel CH2 during the first program time tPROG1.

The storage controller 1200 may transmit the normal program command NPGM CMD to the third non-volatile memory NVM31 at a third point of time t3. The storage controller 1200 may transmit a first normal program command NP1 to the third non-volatile memory NVM31 via data lines DQ_CH3 of the third channel CH3 at the third point of time t3. The storage controller 1200 may transmit a third address A3 to the third non-volatile memory NVM31 via the data lines DQ_CH3 of the third channel CH3. The storage controller 1200 may transmit third data D3 to the third non-volatile memory NVM31 via the data lines DQ_CH3 of the third channel CH3. The storage controller 1200 may transmit a second normal program command NP2 to the third non-volatile memory NVM31 via the data lines DQ_CH3 of the third channel CH3. The third non-volatile memory NVM31 may program the third data D3 to the third address A3 during the first program time tPROG1. The third non-volatile memory NVM31 may output a ready/busy signal R/B in the busy state via a ready/busy line R/B_CH3 of the third channel CH3 during the first program time tPROG1.

The storage controller 1200 may not transmit a normal program command to the fourth non-volatile memory NVM41 at a fourth point of time t4. If a program operation is performed in the fourth non-volatile memory NVM41, the peak current thereof exceeds the allowable current of the storage device 1100. Accordingly, the storage controller 1200 may not transmit the normal program commands to the fourth non-volatile memory NVM41. However, the storage controller 1200 may transmit the slow program command SPGM CMD to the fourth non-volatile memory NVM41 at the fourth point of time t4. The storage controller 1200 may perform the slow program operation having a small amount of peak current instead of the normal program operation having a large amount of peak current. Accordingly, the storage controller 1200 may not wait for a program operation of another non-volatile memory to be completed. The storage controller 1200 may immediately perform the slow program operation.

The storage controller 1200 may transmit the slow program command SPGM CMD to the fourth non-volatile memory NVM41 at the fourth point of time t4. The storage controller 1200 may transmit a first slow program command SP1 to the fourth non-volatile memory NVM41 via data lines DQ_CH4 of the fourth channel CH4 at the fourth point of time t4. The storage controller 1200 may transmit a fourth address A4 to the fourth non-volatile memory NVM41 via the data lines DQ_CH4 of the fourth channel CH4. The storage controller 1200 may transmit fourth data D4 to the fourth non-volatile memory NVM41 via the data lines DQ_CH4 of the fourth channel CH4. The storage controller 1200 may transmit a second slow program command SP2 to the fourth non-volatile memory NVM41 via the data lines DQ_CH4 of the fourth channel CH4. The fourth non-volatile memory NVM41 may program the fourth data D4 to the fourth address A4 during the second program time tPROG2. The fourth non-volatile memory NVM41 may output a ready/busy signal R/B in the busy state via a ready/busy line R/B_CH4 of the fourth channel CH4 during the second program time tPROG2. The fourth non-volatile memory NVM41 may complete the slow program operation at a sixth point of time t6.

The slow program operation takes longer time than the normal program operation. However, since the slow program operation has a small amount of peak current, the storage device 1100 may not wait for the operation of another non-volatile memory to be completed. That is, the storage device 1100 may immediately perform the slow program operation. Accordingly, even if the slow program operation having a long program time is performed, the overall time required to perform the operations may be reduced.

The storage device 1100 only performing the normal program operations may start a normal program operation of the fourth non-volatile memory NVM41 at the fifth point of time t5 and complete the normal program operation of the fourth non-volatile memory NVM41 at the seventh point of time t7. The storage device 1100 performing both the normal program operation and the slow program operation may start a normal program operation of the fourth non-volatile memory NVM41 at the fourth point of time t4 and complete the normal program operation of the fourth non-volatile memory NVM41 at the sixth point of time t6. That is, the program operations of all of the first to fourth non-volatile memories NVM11 to NVM41 may be completed at the sixth point of time t6, which is earlier than the seventh point of time t7. The program performance of the storage device 1100 may be improved.

In other words, the fourth non-volatile memory NVM41 performs the slow program operation, thereby reducing the peak current, but the program time may become longer than the normal program operation. That is, the execution time of the normal program operation for the fourth non-volatile memory NVM41 of FIG. 8B may be shorter than the execution time of the slow program operation for the fourth non-volatile memory NVM41 of FIG. 9B. However, the execution times of all non-volatile memories NVM11 to NVM41 in FIG. 9B may be shorter than the execution times of all non-volatile memories NVM11 to NVM41 in FIG. 8B. Referring to FIG. 9B, the slow program operation is performed instead of blocking the transmission of the normal program command due to the peak current, and thus, the storage device 1100 may more efficiently use the non-volatile memories of all channels.

As described above, the storage device 1100 according to various example embodiments may perform the slow program operation having an increased program time, instead of delaying the program operation of the fourth non-volatile memory NVM41 until the program operation of the first non-volatile memory NVM11 is completed. Accordingly, the total peak current of the storage device may be reduced or prevented from exceeding the allowable current and the performance thereof may be improved.

Although the above-described example embodiments have been described on the basis of the slow program operation of the storage device 1100, the scope of the inventive concepts are not limited thereto. For example, the storage device 1100 may perform a fast program operation. The storage controller 1200 may transmit the fast program command to the non-volatile memory NVM via the data lines DQ. The non-volatile memory NVM may output a ready/busy signal R/B in a busy state to the storage controller 1200 during a third program time in response to the fast program command. The third program time may be shorter than the first program time tPROG1. The peak current of the fast program operation may be greater than the peak current of the normal program operation.

Figure 10:
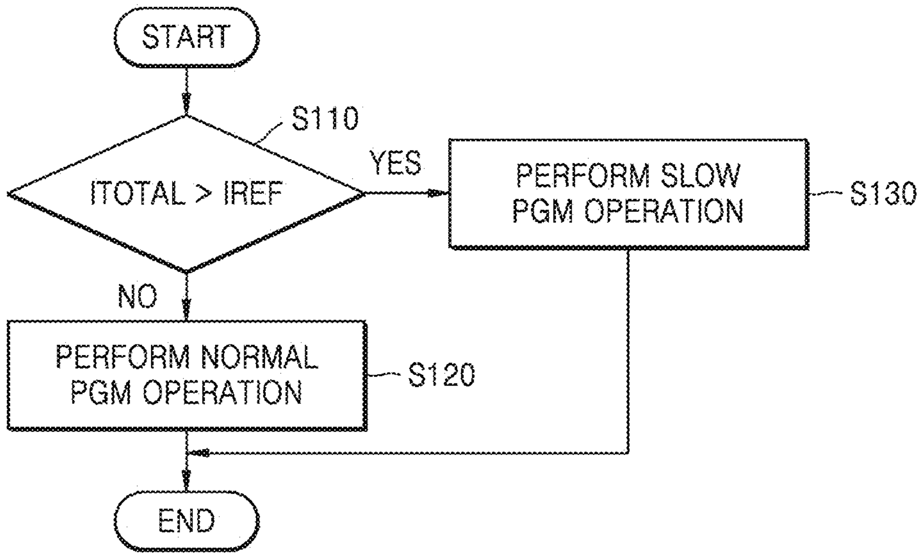
FIG. 10 is a flowchart showing an example of an operation of the storage device of FIG. 1.

FIG. 10 is a flowchart showing an example of an operation of the storage device of FIG. 1.

The storage device 1100 may schedule a slow program command on the basis of a present state. The storage device 1100 may decide to perform either a slow program operation or a normal program operation on the basis of a total peak current. The total peak current may represent the sum of peak current values of operations that are currently being performed. For example, the peak current of the non-volatile memory NVM may represent a page program operation current (e.g., ICC2).

That is, the storage controller 1200 may transmit either the normal program command or the slow program command to the non-volatile memory NVM on the basis of the total peak current. When the total peak current is greater than a reference current, the storage controller 1200 may transmit the slow program command to the non-volatile memory NVM. When the total peak current is less than or equal to the reference current, the normal program command may be transmitted to the non-volatile memory NVM. The storage device 1100 may perform the slow program operation to improve the performance while the total peak current does not exceed the allowable current.

Referring to FIGS. 1 and 10, the storage device 1100 may compare the total peak current with the reference current in operation S110. The total peak current may represent the sum of peak current of the operations that are currently being performed. The reference current may have a desired (or, alternatively an empirically or predetermined) value. The reference current may be determined so as to be fixed or variable by designers, manufacturers, and/or users.

In various example embodiments, the storage device 1100 may store information about the peak current. The information about the peak current may be stored in the buffer memory 1240. The information about peak currents of each of the operations performed in the storage controller 1200 and the non-volatile memory device 1300 may be set in advance. For example, the peak current value of each operation may be determined when manufacturing a storage device, or the peak current value of each operation may be determined during an initialization operation. The storage device 1100 may calculate the total peak current with reference to the pre-stored information about the peak current.

For example, the storage device 1100 may determine a programming method for a fourth non-volatile memory NVM41. A first non-volatile memory NVM11 may be performing a normal program operation. A second non-volatile memory NVM21 may be performing a normal program operation. A third non-volatile memory NVM31 may be performing a normal program operation. The storage device 1100 may calculate the total peak current.

In various example embodiments, the storage device 1100 may calculate the total peak current by adding the peak current values of the operations that are currently being performed. For example, the storage device 1100 may perform the addition operation on the peak current value of the normal program operation of the first non-volatile memory NVM11, the peak current value of the normal program operation of the second non-volatile memory NVM21, and the peak current value of the normal program operation of the third non-volatile memory NVM31. Accordingly, the storage device 1100 may calculate the total peak current.

The storage device 1100 may perform operation S130 when the total peak current is greater than the reference current and may perform operation S120 when the total peak current is less than or equal to the reference current.

In operation S120, the storage device 1100 may perform the normal program operation. The storage device 1100 may determine that the total peak current is less than or equal to the reference current. For example, since there is enough current to perform a normal program operation in the fourth non-volatile memory NVM41, the storage device 1100 may perform the normal program operation for the performance.

In operation S130, the storage device 1100 may perform the slow program operation. The storage device 1100 may determine that the total peak current is greater than the reference current. For example, if the fourth non-volatile memory NVM41 additionally performs a normal program operation, the total peak current exceeds the allowable current, so the storage device 1100 may decide to perform the slow program operation. That is, the storage device 1100 may perform the slow program operation because an amount of the remaining current is insufficient.

As described above, the storage device 1100 may determine a programming method to be additionally performed on the basis of the amount of peak current of the operations that are currently being performed. The storage device 1100 may perform the normal program operation having a short program time if there is sufficient current. If current is insufficient, the storage device 1100 may perform the slow program operation having a long program time but a small peak current.

Figure 11:
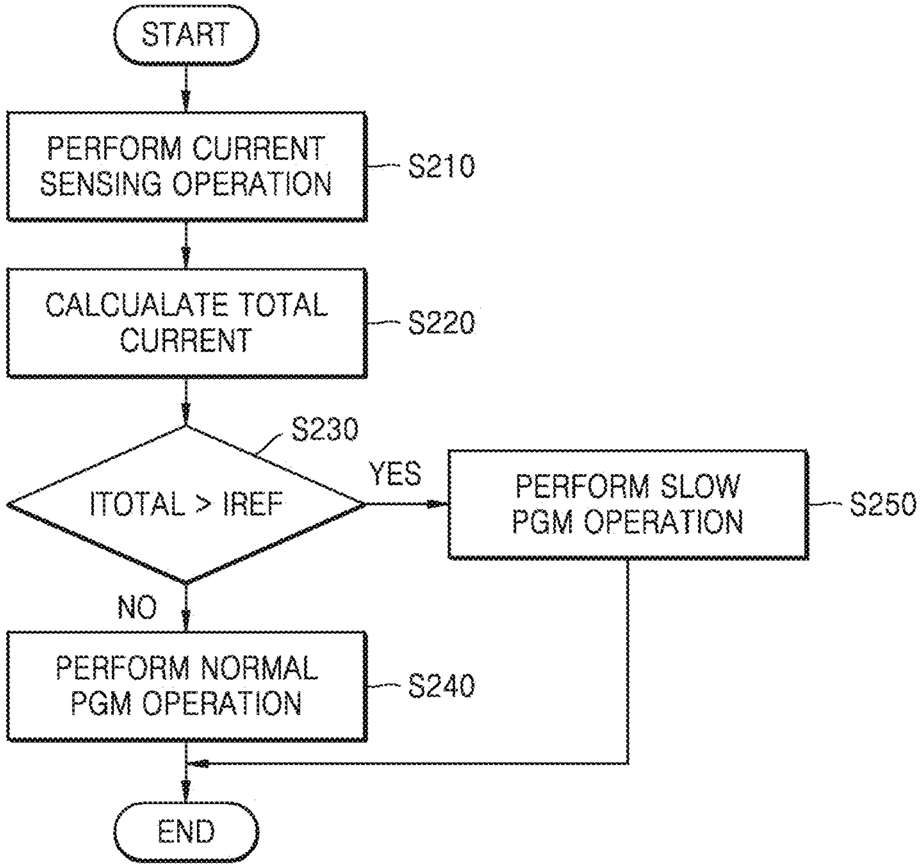
FIG. 11 is a flowchart showing an example of an operation of the storage device of FIG. 1.

FIG. 11 is a flowchart showing an example of an operation of the storage device 1100 of FIG. 1.

Referring to FIGS. 1 and 11, in various example embodiments, the storage device 1100 may perform a current sensing operation in operation S210. The storage device 1100 may sense a load current of the non-volatile memory device 1300. The storage device 1100 may measure the load current of the non-volatile memory device 1300. The storage device 1100 may measure load currents of a plurality of non-volatile memories NVM. For example, a power management integrated circuit of the storage device 1100 may measure a load current, and the load current information including information about the measured load current may be provided to the storage controller 1200.

In operation S220, the storage device 1100 may calculate the total current. The storage device 1100 may calculate the total current on the basis of the load current information. The storage device 1100 may calculate the total current of the plurality of non-volatile memories NVMs.

In operation S230, the storage device 1100 may compare the total current with the reference current. The storage device 1100 may compare the total current with the reference current so as to determine a program operation method. The storage device 1100 may perform operation S250 when the total current is greater than the reference current and may perform operation S240 when the total current is less than or equal to the reference current.

In operation S240, the storage device 1100 may perform a normal program operation. The storage device 1100 may determine that the total current is less than or equal to the reference current. Since there is enough current, the storage device 1100 may perform the normal program operation. The storage controller 1200 may transmit the normal program command to a non-volatile memory NVM. The non-volatile memory NVM may perform the program during the first program time tPROG1.

In operation S250, the storage device 1100 may perform the slow program operation. The storage device 1100 may determine that the total current is greater than the reference current. Since there is not enough current, the storage device 1100 may perform the slow program operation. The storage controller 1200 may perform the slow program operation. The storage controller 1200 may transmit the slow program command to the non-volatile memory NVM. The non-volatile memory NVM may perform the program during a second program time tPROG2.

As described above, the storage device 1100 may determine a programming method on the basis of the preset peak current values. Alternatively, the storage device 1100 may sense the present load current and determine a programming method on the basis of the present load current. The storage device 1100 may perform a programming method appropriate for a present state.

Figure 12:
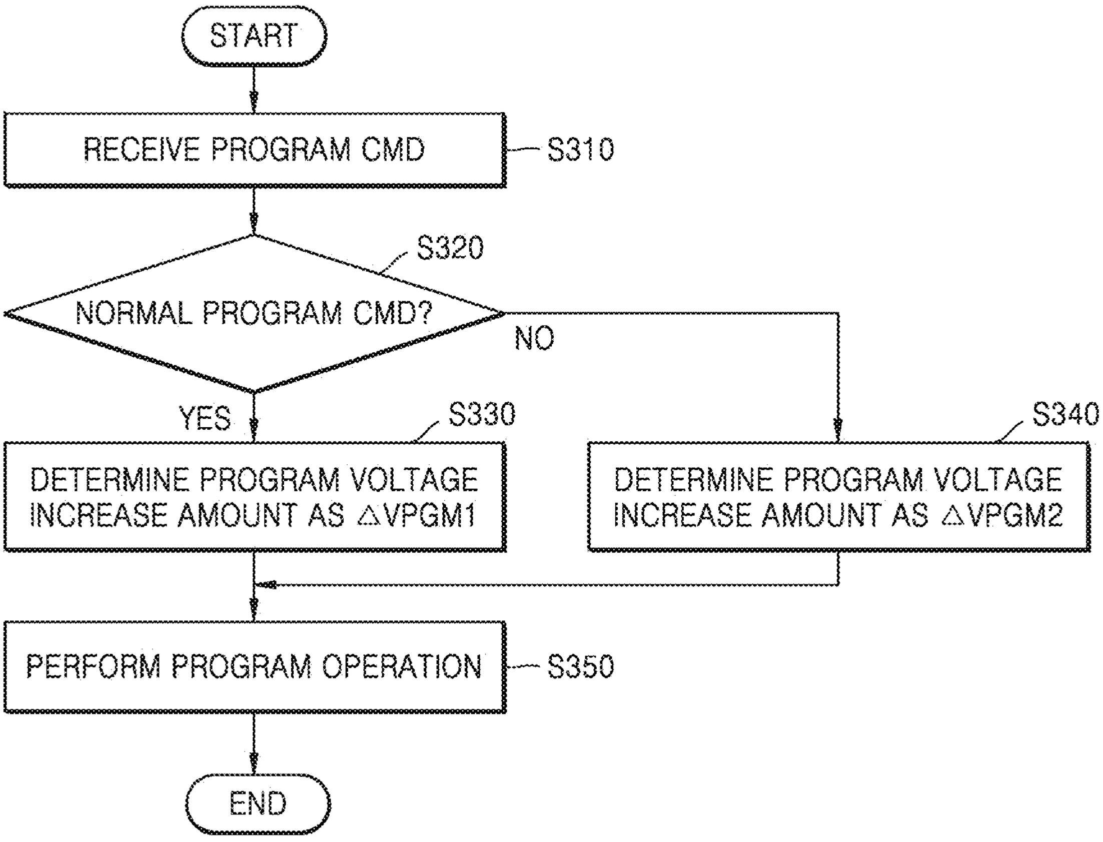
FIG. 12 is a flowchart showing an example of an operation of the non-volatile memory of FIG. 2.

FIG. 12 is a flowchart showing an example of an operation of the non-volatile memory of FIG. 2.

In various example embodiments, a non-volatile memory NVM according to various example embodiments may program memory cells by sequentially performing a plurality of program loops on the basis of an incremental step pulse programming (ISPP) method. In various example embodiments, the amount of increase in the program voltage applied to each of the program loops may be adjusted. When the program voltage increment decreases, the number of program loops increases. In this case, the overall program speed or performance may deteriorate. That is, the program time may increase, but the peak current may decrease.

Referring to FIGS. 2 and 12, the non-volatile memory NVM may receive a program command in operation S310. For example, the non-volatile memory NVM may receive either a normal program command or a slow program command via data lines DQ.

In operation S320, the non-volatile memory NVM may determine whether the received command is the general program command. The non-volatile memory NVM may perform operation S330 when the received command is the general program command and may perform operation S340 when the received command is the slow program command.

In operation S330, the non-volatile memory NVM may determine the program voltage increment as a first program voltage increment Δvpgm1. The first program voltage increment Δvpgm1 may include a parameter used in the normal program operation.

In operation S340, the non-volatile memory NVM may determine the program voltage increment as a second program voltage increment Δvpgm2. The second program voltage increment Δvpgm2 may include a parameter used in the slow program operation. The second program voltage increment Δvpgm2 may be less than the first program voltage increment Δvpgm1. For example, the first program voltage increment Δvpgm1 may be determined in advance. The second program voltage increment Δvpgm2 may be determined in advance.

In operation S350, the non-volatile memory device 1300 may perform a program operation. The non-volatile memory device 1300 may perform the program operation on the basis of the determined program voltage increment. That is, in response to the normal program command, the non-volatile memory may perform the normal program operation on the basis of the first program voltage increment Δvpgm1. In response to the slow program command, the non-volatile memory may perform the slow program operation on the basis of the second program voltage increment Δvpgm2.

As described above, a first program operation (i.e., the normal program operation) may include a plurality of first program loops, and each of the first program loops may include a program section for applying a program voltage and a verification section for applying a verification voltage. When the first program loops are repeated, the level of the program voltage may increase by the first program voltage increment Δvpgm1. A second program operation (i.e., the slow program operation) may include a plurality of second program loops, and each of the second program loops may include a program section for applying a program voltage and a verification section for applying a verification voltage. When the second program loops are repeated, the level of the program voltage may increase by the second program voltage increment Δvpgm2.

Figure 13A:
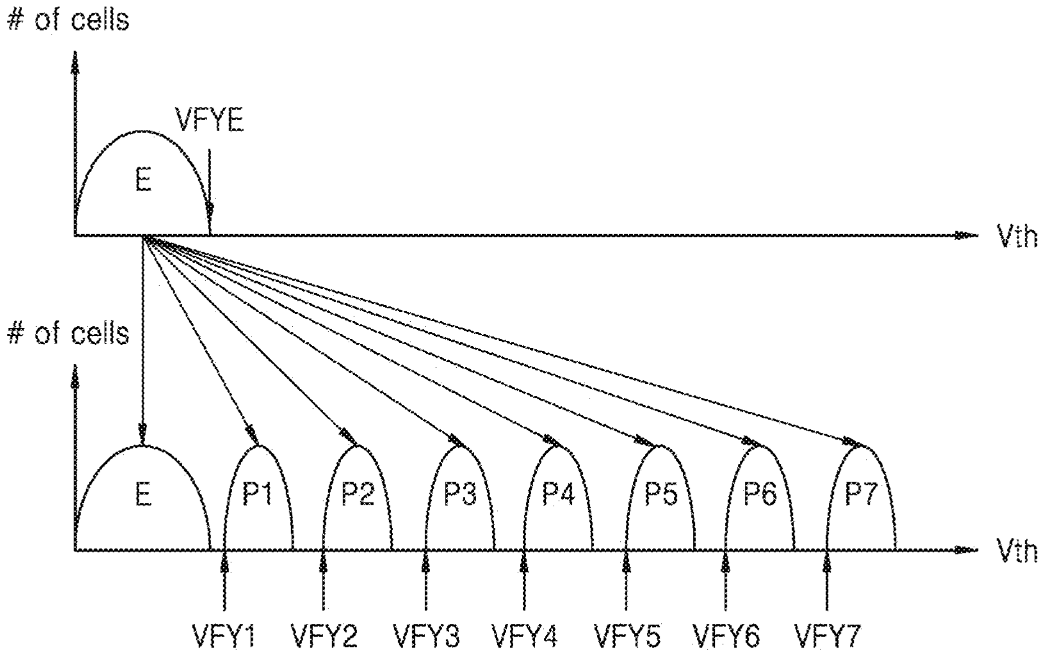
FIG. 13A is a scatter diagram illustrating a program operation of the non-volatile memory of FIG. 3.
Figure 13B:
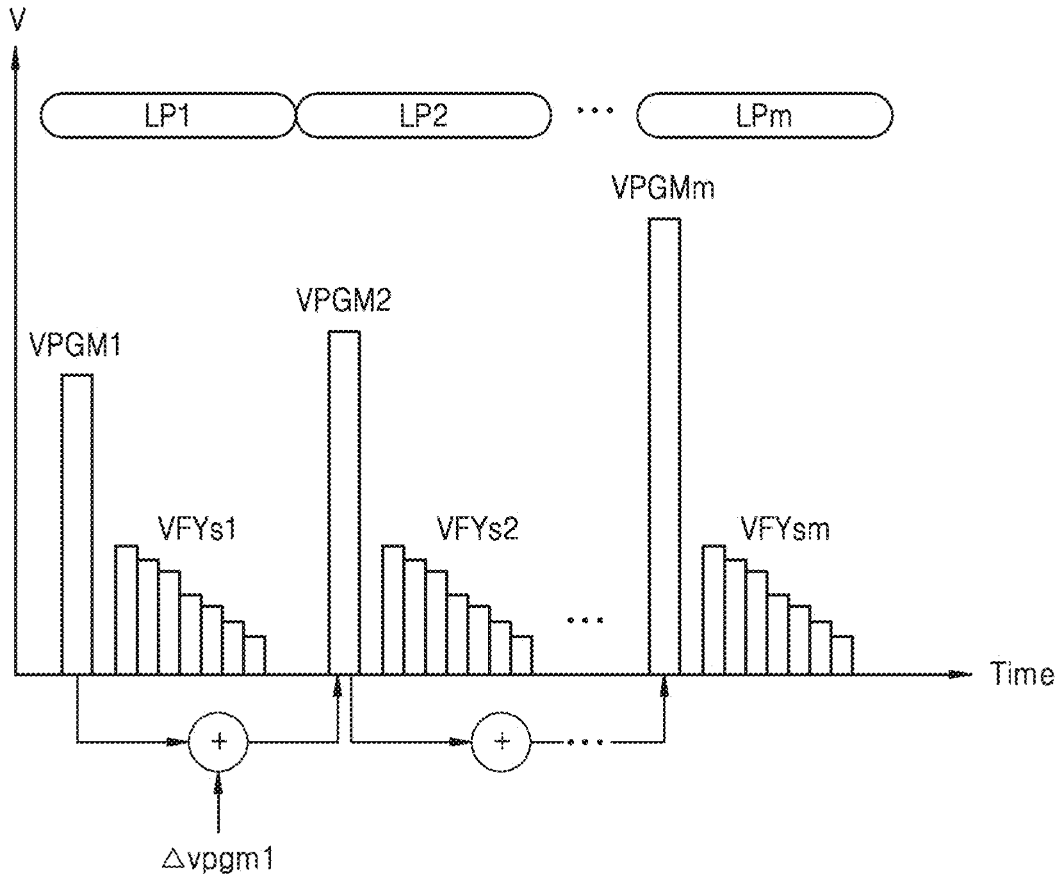
FIGS. 13B and 13C are diagrams showing examples of operations of the non-volatile memory of FIG. 3.
Figure 13C:
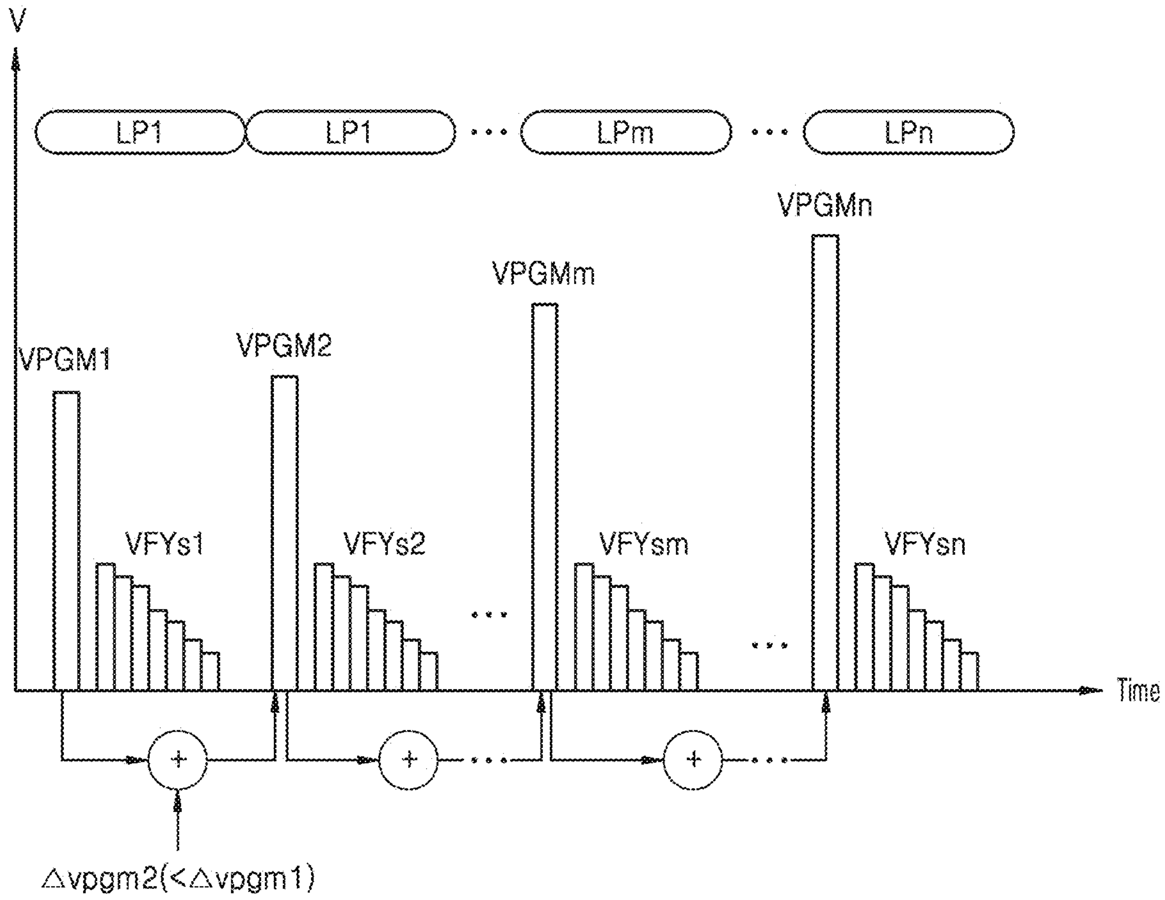

FIG. 13A is a scatter diagram illustrating a program operation of the non-volatile memory NVM of FIG. 3. FIGS. 13B and 13C are diagrams showing examples of operations of the non-volatile memory NVM of FIG. 3. FIG. 13B shows a normal program operation, and FIG. 13C shows a slow program operation.

In various example embodiments, the horizontal axes of the scatter diagrams in FIG. 13A represent threshold voltages of memory cells MC, and the vertical axes thereof represent the numbers of memory cells. For example, a change in threshold voltages when 3 bits are written to each of the memory cells is shown in FIG. 13A.

Referring to FIGS. 3 and 13A, the non-volatile memory NVM may store or program data in the memory cells by converting the threshold voltage of the plurality of memory cells MC of the memory cell array 1330.

For example, the non-volatile memory NVM may perform program operations on memory cells on the basis of the data to be stored so that memory cells in an erase state E have one of an erase state E and a plurality of program states P1 to P7. In various example embodiments, the program operation may be performed per a word line or per a page.

For example, during the program operation, the non-volatile memory NVM may perform the program operations on the memory cells so that memory cells in the erase state E have one of the erase state E and the plurality of program states P1 to P7. During the program operation, verification voltages VFY1 to VFT7 may be used. For example, memory cells programmed in the program state P1 are programmed so that the memory cells have threshold voltages higher than the verification voltage VFY1. Since the other program states P2 to P7 are also similar to the program state P1, the detailed description thereof is omitted.

In response to the normal program command, the row decoder 1360 of the non-volatile memory NVM may perform the plurality of program loops on the basis of the first program voltage increment Δvpgm1. In response to the slow program command, the row decoder 1360 of the non-volatile memory NVM may perform the plurality of program loops on the basis of the second program voltage increment Δvpgm2. The first program voltage increment Δvpgm1 may be greater than the second program voltage increment Δvpgm2.

Referring to FIG. 13B, the program operation may include a plurality of program loops LP1 to LPm. For example, the normal program operation may include the plurality of program loops LP1 to LPm (or hereinafter referred to as first to m-th program loops LP1 to LPm). The program operation may be performed by repeating the program loops. As the program loop progresses (or repeats), the level of the program voltage VPGM may increase. In the normal program operation, the program voltage VPGM may increase by the first program voltage increment Δvpgm1.

Each of the plurality of program loops LP1 to LPm may include a program operation of applying a program voltage VPGM and a verification operation of applying verification voltages VFY. During the program operation, the voltages of the bit lines BL may be set up. For example, the bit lines BL may be connected to selected memory cells (i.e., memory cells subjected to the program operation) connected to the selected word line. The program voltage (e.g., the power supply voltage) may be set up in the bit line connected to the memory cells, having the threshold voltages to be raised (i.e., programmed), among the selected memory cells. The program inhibit voltage (e.g., the ground voltage or similar low voltage) may be set up in the bit line connected to the memory cells, having the threshold voltages to be maintained (i.e., program-inhibited), among the selected memory cells.

A pass voltage VPASS may be applied to the word lines WL. The pass voltage VPASS may turn on the memory cells connected to the word lines WL. Subsequently, the program voltage VPGM may be applied to the selected word line. The program voltage VPGM may increase the threshold voltages of the memory cells to be programmed.

During the verification operation, the verification voltages may be applied to the selected word line. For example, when 3-bits are programmed in one memory cell, the threshold voltage of the one memory cell may be adjusted (or maintained) to one of an erase state and seven program states by the program operation. The verification voltages may include 7 voltages respectively corresponding to 7 program states.

For example, when n-bits are programmed in one memory cell (n is a positive integer), the threshold voltage of the one memory cell may be adjusted (or maintained) to one of an erase state and $2^n$-1 program states by the program operation. The verification voltages may include $2^n$-1 voltages respectively corresponding to $2^n$-1 program states.

FIG. 13B shows that verification voltages are applied in the order from high level voltage to low level voltage. However, the order in which the verification voltages are applied may be independent of the levels of the verification voltages. Alternatively, the verification voltages may be applied in the order from low level voltage to high level voltage.

For example, in the first program loop LP1, the non-volatile memory NVM may apply a first program voltage VPGM1 to a selected word line WL_sel and may thus increase the threshold voltage of the memory cells connected to the selected word line WL_sel. The non-volatile memory NVM may apply a first verification voltage set VFYs1 to the selected word line WL_sel and may thus verify the program state of the memory cells connected to the selected word line WL_sel. In various example embodiments, the first verification voltage set VFYs1 may include some of a plurality of verification voltages VFY1 to VFY7. In the first program loop LP1, the program states corresponding to the verification voltages of the first verification voltage set VFYs1 may be verified.

Next, in the second program loop LP2, the non-volatile memory NVM may apply a second program voltage VPGM2 to the selected word line WL_sel. The difference between the second program voltage VPGM2 and the first program voltage VPGM1 may be equal to the first program voltage increment Δvpgm1. That is, the second program voltage VPGM2 may have a voltage increased from the first program voltage VPGM1 by the first program voltage increment Δvpgm1.

In the second program loop LP2, the non-volatile memory NVM may apply a second verification voltage set VFYs2 to the selected word line WL_sel and may thus verify the program state of the memory cells connected to the selected word line WL_sel. In various example embodiments, the second verification voltage set VFYs2 may be the same as the first verification voltage set VFYs1. Alternatively, the second verification voltage set VFYs2 may be partially different from the first verification voltage set VFYs1. Alternatively, the second verification voltage set VFYs2 may be completely different from the first verification voltage set VFYs1.

In the m-th program loop LPm, the non-volatile memory NVM may apply both an m-th program voltage VPGMm and an m-th verification voltage set VFYsm to the selected word line WL_sel. As described above, in the normal program operation, the program voltage of each program loop may be increased by the first program voltage increment Δvpgm1 from the program voltage of the previous loop.

Referring to FIG. 13C, the slow program operation may include a plurality of program loops LP1 to LPn (or hereinafter referred to as first to n-th program loops LP1 to LPn). Herein, n is greater than m. When the program loop of the slow program operation progresses (or repeats), the level of the program voltage VPGM may increase by the second program voltage increment Δvpgm2.

In a first program loop LP1, the non-volatile memory NVM may apply a first program voltage VPGM1 to a selected word line WL_sel. In the first program loop LP1, the non-volatile memory NVM may apply a first verification voltage set VFYs1 to the selected word line WL_sel and may thus verify the program state of the memory cells connected to the selected word line WL_sel.

In a second program loop LP2, the non-volatile memory NVM may apply a second program voltage VPGM2 to the selected word line WL_sel. The difference between the second program voltage VPGM2 and the first program voltage VPGM1 may be equal to the second program voltage increment Δvpgm2. That is, the second program voltage VPGM2 may have a voltage increased from the first program voltage VPGM1 by the second program voltage increment Δvpgm2. In the second program loop LP2, the non-volatile memory NVM may apply a second verification voltage set VFYs2 to the selected word line WL_sel and may thus verify the program state of the memory cells connected to the selected word line WL_sel.

In the m-th program loop LPm, the non-volatile memory NVM may apply an m-th program voltage VPGMm to the selected word line WL_sel. In the m-th program loop LPm, the non-volatile memory NVM may apply the m-th verification voltage set VFYsm to the selected word line WL_sel and may thus verify the program state of the memory cells connected to the selected word line WL_sel.

In an n-th program loop LPn, the non-volatile memory NVM may apply an n-th program voltage VPGMn to the selected word line WL_sel. In the n-th program loop LPn, the non-volatile memory NVM may apply an n-th verification voltage set VFYsn to the selected word line WL_sel and may thus verify the program state of the memory cells connected to the selected word line WL_sel.

The program voltage increment of the slow program operation (i.e., the second program voltage increment Δvpgm2) may be less than the program voltage increment of the normal program operation (i.e., the first program voltage increment Δvpgm1). Accordingly, the number of program loops may increase. That is, the number of program loops in the slow program operation (i.e., n) may be greater than the number of program loops in the normal program operation (i.e., m). Accordingly, the slow program operation may have a program time longer than that of the normal program operation. However, the peak current of the slow program operation may be smaller than the peak current of the normal program operation.

Figure 14:
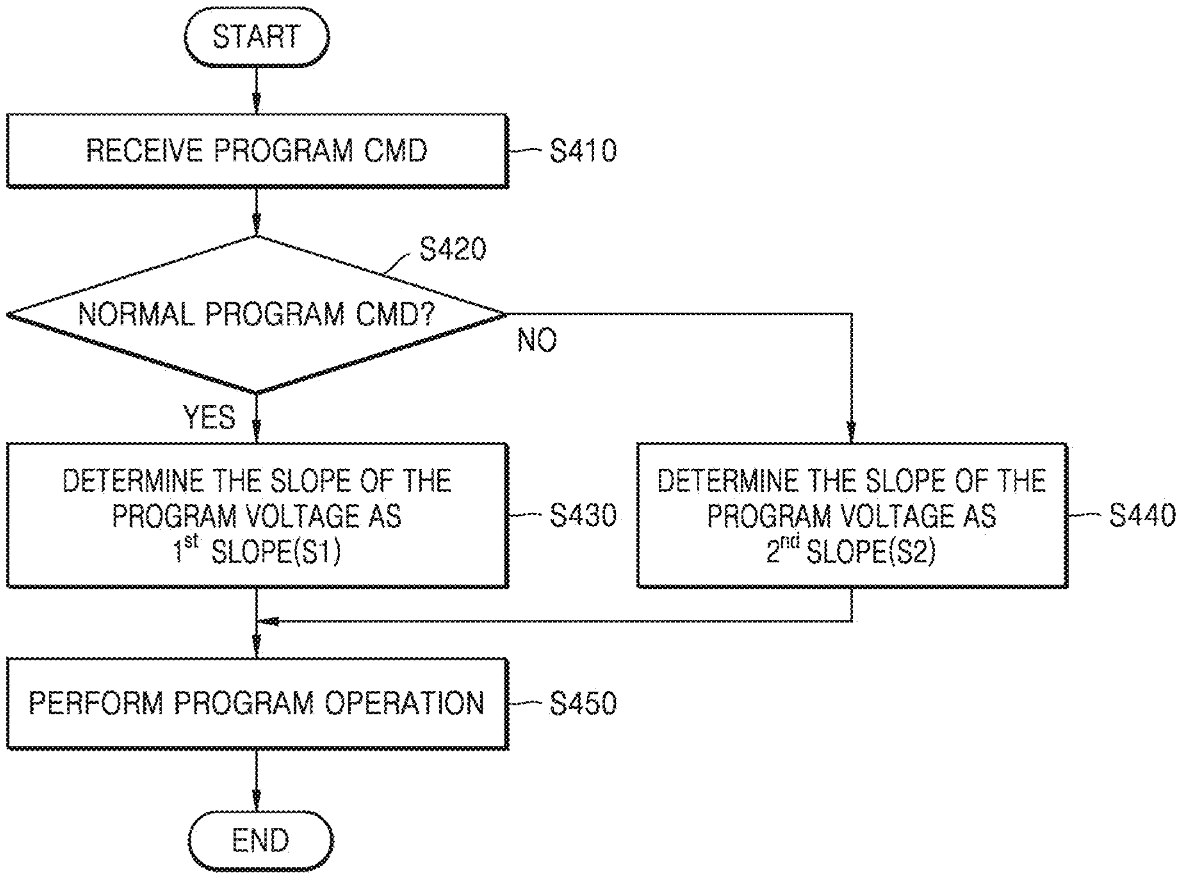
FIG. 14 is a flowchart showing an example of an operation of the non-volatile memory of FIG. 2.

FIG. 14 is a flowchart showing an example of an operation of the non-volatile memory NVM of FIG. 2.

Referring to FIGS. 2 and 14, the non-volatile memory NVM may increase with a first slope S1, the program voltage applied to the selected word line in a first program operation (i.e., a normal program operation). The non-volatile memory NVM may increase, with a second slope S2, the program voltage applied to the selected word line in a second program operation (i.e., a slow program operation).

In operation S410, the non-volatile memory NVM may receive a program command. For example, the non-volatile memory NVM may receive either a normal program command or a slow program command via data lines DQ.

In operation S420, the non-volatile memory NVM may determine whether the received command is the general program command. The non-volatile memory NVM may perform operation S430 when the received command is the general program command and may perform operation S440 when the received command is the slow program command.

In operation S430, the non-volatile memory NVM may determine the slope of the program voltage as the first slope S1. The first slope S1 may include a parameter used in the normal program operation.

In operation S440, the non-volatile memory NVM may determine the slope of the program voltage as the second slope S2. The second slope S2 may include a parameter used in the slow program operation. The second slope S2 may be less than the first slope S1.

In operation S450, the non-volatile memory NVM may perform a program operation. The non-volatile memory NVM may perform the program operation using the determined slope. The non-volatile memory NVM may apply a program voltage rising with the first slope S1 to the selected word line in response to the normal program command. The non-volatile memory NVM may apply a program voltage rising with the second slope S2 to the selected word line in response to the slow program command.

As described above, the non-volatile memory NVM may adjust the slope of the program voltage. In order to adjust the peak current, the non-volatile memory NVM may change the slope of the program voltage applied to the selected word line. The non-volatile memory NVM may increase the program voltage with a gentle slope in the slow program operation so as to reduce the peak current. The non-volatile memory NVM may increase the program voltage with a steep slope in the normal program operation so as to achieve the short program time.

Figure 15A:
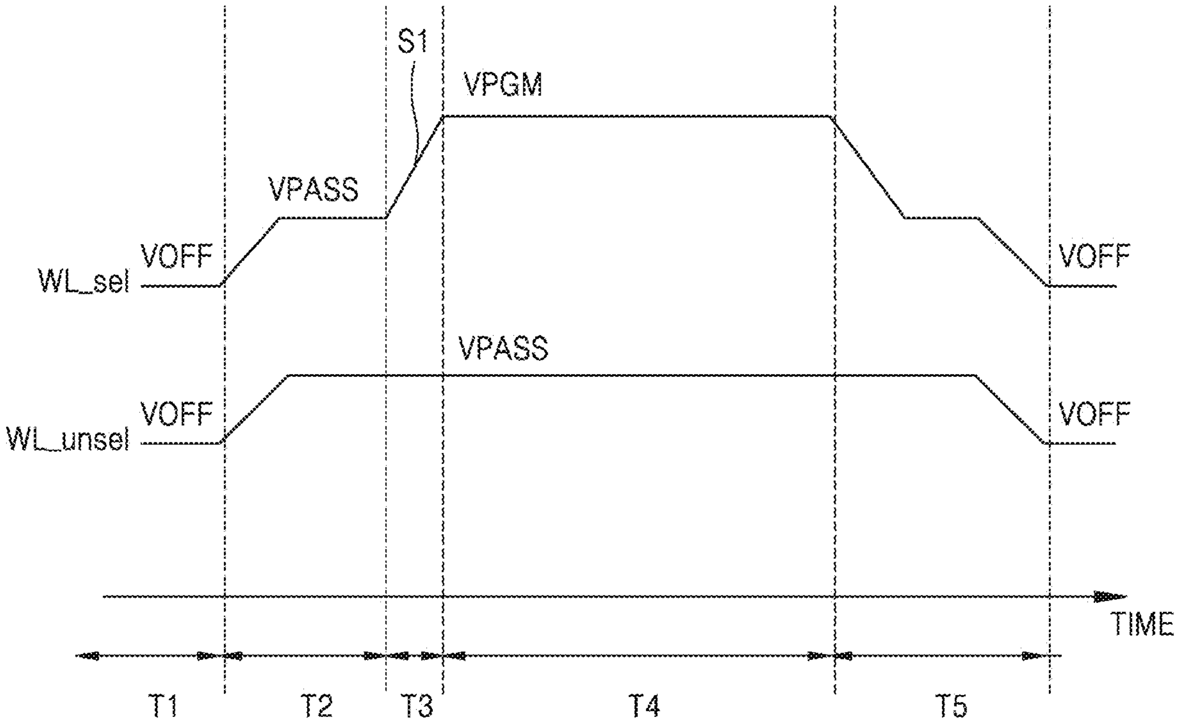
FIGS. 15A and 15B show examples of voltages applied to the memory block of FIG. 4 during the program operation.
Figure 15B:
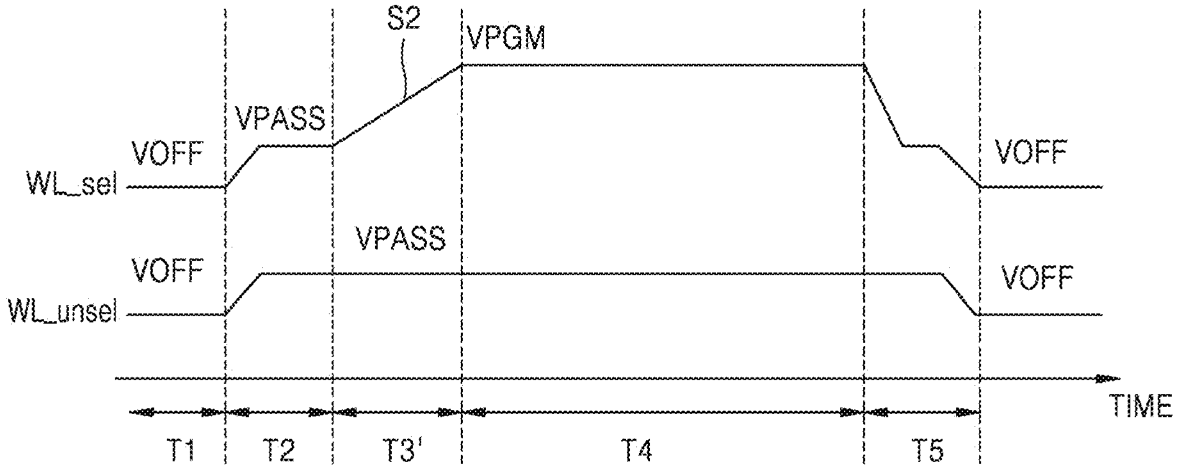

FIGS. 15A and 15B show examples of voltages applied to the memory block of FIG. 4 during the program operation.

FIG. 15A shows the normal program operation and FIG. 15B shows the slow program operation. The row decoder of the non-volatile memory NVM may apply a program voltage rising with a first slope to a selected word line in response to the normal program command and may apply a program voltage rising with a second slope to a selected word line in response to the slow program command.

Referring to FIGS. 4 and 15A, the non-volatile memory NVM may apply an off-voltage VOFF to a selected word line WL_sel in a first section T1. The non-volatile memory NVM may apply an off-voltage VOFF to an unselected word line WL_unsel in the first section T1. The non-volatile memory NVM may apply a pass voltage VPASS to the selected word line WL_sel in a second section T2. The non-volatile memory NVM may apply the pass voltage VPASS to the unselected word line WL_unsel in the second section T2.

In a third section T3, the voltage applied to the selected word line WL_sel may increase from the pass voltage VPASS to a program voltage VPGM. The voltage applied to the selected word line WL_sel in the third section T3 may rise with the first slope S1. The voltage applied to the unselected word line WL_unsel in the third section T3 may be maintained as the pass voltage VPASS. The first slope S1 may be greater than the second slope S2.

The non-volatile memory NVM may apply the program voltage VPGM to the selected word line WL_sel in a fourth section T4. The non-volatile memory NVM may apply the pass voltage VPASS to the unselected word line WL_unsel in the fourth section T4.

In a fifth section T5, the voltage applied to the selected word line WL_sel may decrease from the program voltage VPGM to the off-voltage VOFF. In the fifth section T5, the voltage applied to the unselected word line WL_unsel may decrease from the pass voltage VPASS to the off-voltage VOFF.

Referring to FIGS. 4 and 15B, the non-volatile memory NVM may apply an off-voltage VOFF to a selected word line WL_sel in a first section T1. The non-volatile memory NVM may apply an off-voltage VOFF to an unselected word line WL_unsel in the first section T1. The non-volatile memory NVM may apply a pass voltage VPASS to the selected word line WL_sel in a second section T2. The non-volatile memory NVM may apply the pass voltage VPASS to the unselected word line WL_unsel in the second section T2.

In a third section T3', the voltage applied to the selected word line WL_sel may increase from the pass voltage VPASS to a program voltage VPGM. The voltage applied to the selected word line WL_sel in the third section T3' may rise with the second slope S2. The voltage applied to the unselected word line WL_unsel in the third section T3' may be maintained as the pass voltage VPASS.

The non-volatile memory NVM may apply the program voltage VPGM to the selected word line WL_sel in a fourth section T4. The non-volatile memory NVM may apply the pass voltage VPASS to the unselected word line WL_unsel in the fourth section T4.

In a fifth section T5, the voltage applied to the selected word line WL_sel may decrease from the program voltage VPGM to the off-voltage VOFF. In the fifth section T5, the voltage applied to the unselected word line WL_unsel may decrease from the pass voltage VPASS to the off-voltage VOFF.

The third section T3 of the normal program operation may be shorter than the third section T3' of the slow program operation. In the normal program operation, the voltage applied to the selected word line may rise with the first slope S1. In the slow program operation, the voltage applied to the selected word line may rise with the second slope S2. The first slope S1 may be greater than the second slope S2.

The non-volatile memory NVM may adjust the slope of the program voltage applied to the selected word line during the program operation. The non-volatile memory NVM may control the charging speed and time for the selected word line to rise from the pass voltage VPASS to the level of the program voltage VPGM. An increase in peak current may be reduced or prevented by controlling the slope of the voltage.

The non-volatile memory NVM may increase the program voltage from an initial voltage level to a target voltage level. The non-volatile memory NVM may adjust the rising slope of the voltage on the basis of steps and cycles. For example, the non-volatile memory NVM may reduce the rising slope of the voltage by increasing the cycle. Alternatively, the non-volatile memory NVM may reduce the rising slope of the voltage by decreasing the step.

In the normal program operation, the non-volatile memory NVM may reduce the program time by applying the voltage with the high rising slope (e.g., the first slope S1) to the selected word line. In the slow program operation, the non-volatile memory NVM may reduce the peak current by applying the voltage with the low rising slope (e.g., the second slope S2) to the selected word line. In the program operation, the slope of the voltage applied to the selected word line may change depending on the programming method.

Figure 16:
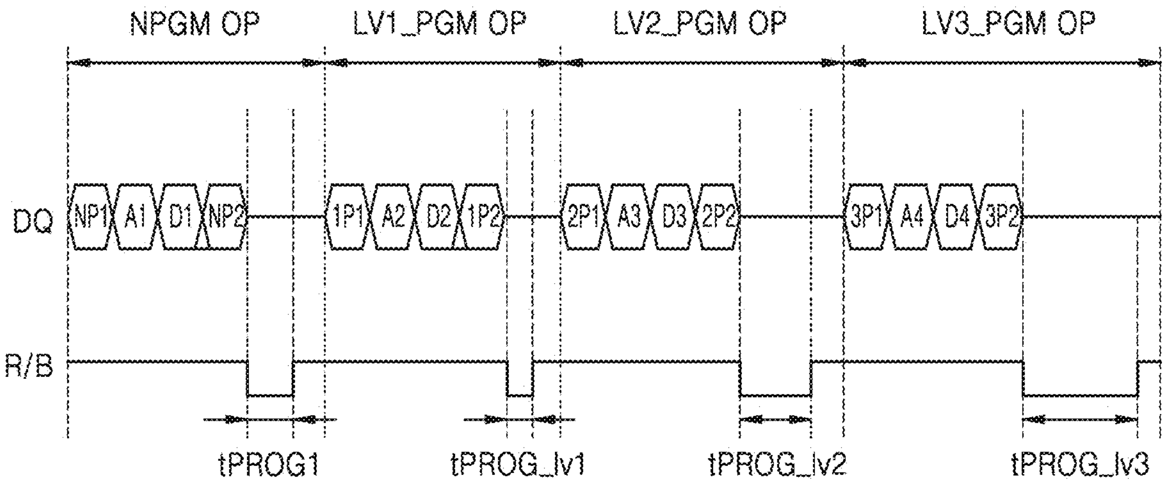
FIG. 16 is a timing chart showing an example of an operation of the storage device of FIG. 1.

FIG. 16 is a timing chart showing an example of an operation of the storage device 1100 of FIG. 1.

Referring to FIGS. 1 and 16, the storage device 1100 may perform a normal program operation and level program operations. The program time of the normal program operation may be different from the program time of each of the level program operations. One of the level program operations may be the slow program operation described with reference to FIGS. 1 to 15B. For example, the normal program operation may have a first program time tPROG1. A first level program operation may have a first level program time tPROG_LV1. A second level program operation may have a second level program time tPROG_LV2. A third level program operation may have a third level program time tPROG_LV3. Hereinafter, the number of level program operations is assumed to be three. However, the scope of the inventive concepts are not limited thereto, and the number of level program operations may increase or decrease depending on implementation.

For example, the first level program time tPROG_LV1 may be shorter than the first program time tPROG1. The second level program time tPROG_LV2 may be longer than the first program time tPROG1. The third level program time tPROG_LV3 may be longer than the second level program time tPROG_LV2.

For example, the peak current of the first level program operation may be greater than the peak current of the normal program operation. The peak current of the second level program operation may be less than the peak current of the normal program operation. The peak current of the third level program operation may be less than the peak current of the second level program operation.

The storage controller 1200 may perform a normal program operation NPGM OP. The storage controller 1200 may transmit a normal program command to the non-volatile memory NVM via the data lines DQ. The non-volatile memory NVM may perform a program during the first program time tPROG1 in response to the normal program command. The non-volatile memory NVM may output a ready/busy signal R/B in a busy state during the first program time tPROG1 in response to the normal program command.

The storage controller 1200 may transmit a first normal program command NP1 during a command input section CMD Input. Subsequently, the storage controller 1200 may transmit a first address A1 during an address input section ADDR Input. Subsequently, the storage controller 1200 may transmit first data D1 during a data input section Data Input. Subsequently, the storage controller 1200 may transmit a second normal program command NP2 during a command input section CMD Input. The non-volatile memory device 1300 may store the first data D1 received during the first program time tPROG1 in a region corresponding to the first address A1 in response to the second normal program command NP2. The storage controller 1200 may receive the ready/busy signal R/B in the busy state during the first program time tPROG1.

The storage controller 1200 may transmit the first level program command to the non-volatile memory NVM via the data lines DQ. The non-volatile memory NVM may perform a program during the first level program time tPROG_LV1 in response to the first level program command. The non-volatile memory NVM may output a ready/busy signal R/B in a busy state during the first level program time tPROG_LV1 in response to the first level program command.

The storage controller 1200 may perform a first level program operation LV1_PGM OP. The storage controller 1200 may transmit a first level 1-program command 1P1 during a command input section CMD Input. Subsequently, the storage controller 1200 may transmit a second address A2 during an address input section ADDR Input. Subsequently, the storage controller 1200 may transmit second data D2 during a data input section Data Input. Subsequently, the storage controller 1200 may transmit a second level-1 program command 1P2 during a command input section CMD Input. The non-volatile memory device 1300 may store the second data D2 received during the first level program time tPROG_LV1 in a region corresponding to the second address A2 in response to the second level-1 program command 1P2. The storage controller 1200 may receive the ready/busy signal R/B in the busy state during the first level program time tPROG_LV1. The first level 1-program command 1P1 and the second level-1 program command 1P2 may include a command set for the first level program operation.

The storage controller 1200 may transmit the second level program command to the non-volatile memory NVM via the data lines DQ. The non-volatile memory NVM may perform a program during the second level program time tPROG_LV2 in response to the second level program command. The non-volatile memory NVM may output a ready/busy signal R/B in a busy state during the second level program time tPROG_LV2 in response to the second level program command.

For example, the storage controller 1200 may perform a second level program operation LV2_PGM OP. The storage controller 1200 may transmit a first level 2-program command 2P1 during a command input section CMD Input. Subsequently, the storage controller 1200 may transmit a third address A3 during an address input section ADDR Input. Subsequently, the storage controller 1200 may transmit third data D3 during a data input section Data Input. Subsequently, the storage controller 1200 may transmit a second level 2-program command 2P2 during a command input section CMD Input. The non-volatile memory device 1300 may store the third data D3 received during the second level program time tPROG_LV2 in a region corresponding to the third address A3 in response to the second level 2-program command 2P2. The storage controller 1200 may receive the ready/busy signal R/B in the busy state during the second level program time tPROG_LV2. The first level 2-program command 2P1 and the second level 2-program command 2P2 may include a command set for the second level program operation.

The storage controller 1200 may transmit the third level program command to the non-volatile memory NVM via the data lines DQ. The non-volatile memory NVM may perform a program during the third level program time tPROG_LV3 in response to the third level program command. The non-volatile memory NVM may output a ready/busy signal R/B in a busy state during the third level program time tPROG_LV3 in response to the third level program command.

The storage controller 1200 may perform a third level program operation LV3_PGM OP. The storage controller 1200 may transmit a first level 3-program command 3P1 during a command input section CMD Input. Subsequently, the storage controller 1200 may transmit a fourth address A4 during an address input section ADDR Input. Subsequently, the storage controller 1200 may transmit fourth data D4 during a data input section Data Input. Subsequently, the storage controller 1200 may transmit a second level 3-program command 3P2 during a command input section CMD Input. The non-volatile memory device 1300 may store the fourth data D4 received during the third level program time tPROG_LV3 in a region corresponding to the fourth address A4 in response to the second level 3-program command 3P2. The storage controller 1200 may receive the ready/busy signal R/B in the busy state during the third level program time tPROG_LV3. The first level 3-program command 3P1 and the second level 3-program command 3P2 may include a command set for the third level program operation.

The non-volatile memory NVM may support a plurality of program commands with different amounts of current consumption. That is, the non-volatile memory NVM may perform a plurality of level program operations having different peak currents. When there is insufficient current, the storage controller 1200 may transmit the level program command having a low peak current and a long program time to the non-volatile memory NVM. When there is sufficient current, the storage controller 1200 may transmit the level program command having a high peak current and a short program time to the non-volatile memory NVM. The storage controller 1200 may determine an optimal level program command on the basis of the present state. The storage controller 1200 may improve performance by transmitting the optimal level program command to the non-volatile memory NVM. For example, when high performance is not required, the storage controller 1200 may transmit only a level program command having a low peak current and a long program time to the non-volatile memory NVM. The storage device 1100 may use a plurality of level program commands, thereby limiting or preventing transmission of commands from being blocked due to the current.

Figure 17:
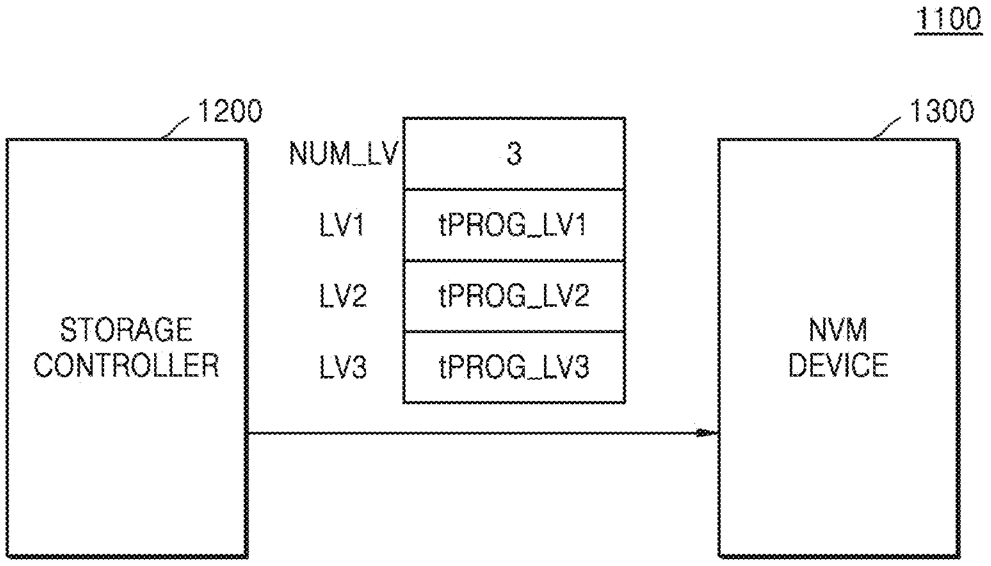
FIG. 17 is a diagram showing an example of an operation of the storage device of FIG. 1.

FIG. 17 is a diagram showing an example of an operation of the storage device 1100 of FIG. 1.

Referring to FIGS. 1 and 17, in various example embodiments, the storage device 1100 may manage the number of level program operations. The storage device 1100 may manage program times corresponding to the level program operations.

The storage controller 1200 may determine the number of level program operations. The storage controller 1200 may determine the program times corresponding to the level program operations. For example, the storage controller 1200 may determine the number of level program operations as '3' in addition to a normal program operation. The storage controller 1200 may determine the program time of a first level program operation as a first level program time tPROG_LV1. The storage controller 1200 may determine the program time of a second level program operation as a second level program time tPROG_LV2. The storage controller 1200 may determine the program time of a third level program operation as a third level program time tPROG_LV3.

The storage controller 1200 may transmit the information about the number of level program operations and the information about the program times to the non-volatile memory device 1300. The storage controller 1200 may use a set feature command and transmit the information about the number of level program operations and the information about the program times to the non-volatile memory device 1300.

For example, the storage controller 1200 may transmit the set feature command to the non-volatile memory device 1300 via the data lines DQ during the command input section CMD Input. Subsequently, the storage controller 1200 may transmit a feature address to the non-volatile memory device 1300 via the data lines DQ during the address input section ADDR Input. For example, the feature address may represent a space in which the information about the level program operation is stored. Subsequently, the storage controller 1200 may transmit feature information to the non-volatile memory device 1300 via the data lines DQ during the data input section Data Input. The feature information may include the information about the number of level program operations or the information about the program times.

For example, the feature information may include '3', which is the number of level program operations. The feature information may include the first level program time tPROG_LV1, which is the program time of the first level program operation. The feature information may include the second level program time tPROG_LV2, which is the program time of the second level program operation. The feature information may include the third level program time tPROG_LV3, which is the program time of the third level program operation.

As described above, the storage controller 1200 may transmit, to the non-volatile memory NVM, the level program command having a shorter or longer program time than the normal program command. The non-volatile memory NVM may output the ready/busy signal in the busy state during a program time, which is shorter or longer than the first program time tPROG1, in response to the level program command. The storage controller 1200 may transmit, to the non-volatile memory NVM, the set feature command including the information about the number of levels and the information about the program times corresponding to the levels.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A storage device comprising:

a storage controller configured to transmit either a normal program command or a slow program command to a non-volatile memory via data lines; and the non-volatile memory comprising a plurality of non-volatile memories, wherein each of the plurality of non-volatile memories is configured to output a ready/busy signal to the storage controller during a first program time in response to the normal program command, and output a ready/busy signal to the storage controller during a second program time, the second program time being different from the first program time, in response to the slow program command.

2. The storage device of claim 1, wherein the storage controller is further configured to transmit either the normal program command or the slow program command to the non-volatile memory based on a total peak current, and wherein the total peak current represents a sum of peak current values of operations that are being performed.

3. The storage device of claim 2, wherein the storage controller is further configured to transmit the slow program command to the non-volatile memory in response to the total peak current being greater than a reference current, and transmit the normal program command to the non-volatile memory in response to the total peak current being less than or equal to the reference current.

4. The storage device of claim 3, wherein the storage controller is further configured to calculate the total peak current by adding the peak current values of the operations that are being performed, and compare the total peak current with the reference current.

5. The storage device of claim 1, wherein the second program time is longer than the first program time.

6. The storage device of claim 1, wherein each of the plurality of non-volatile memories is configured to perform a first program operation during the first program time in response to the normal program command, and perform a second program operation during the second program time in response to the slow program command.

7. The storage device of claim 6, wherein each of the plurality of non-volatile memories is configured to increase a program voltage, using a first slope, to a word line selected in the first program operation, and increase a program voltage, using a second slope, to a word line selected in the second program operation.

8. The storage device of claim 7, wherein the first slope is greater than the second slope.

9. The storage device of claim 1, wherein the storage controller is further configured to transmit a first normal program command to a first non-volatile memory among the plurality of non-volatile memories via a first channel, transmit a second normal program command to a second non-volatile memory among the plurality of non-volatile memories via a second channel, transmit a third normal program command to a third non-volatile memory among the plurality of non-volatile memories via a third channel, and transmit a slow program command to a fourth non-volatile memory among the plurality of non-volatile memories via a fourth channel, and wherein a normal program operation of the first non-volatile memory, a normal program operation of the second non-volatile memory, a normal program operation of the third non-volatile memory, and a slow program operation of the fourth non-volatile memory are performed simultaneously.

10. The storage device of claim 7, wherein the first program operation comprises a plurality of first program loops, each of the first program loops comprises a program section for applying a program voltage, and a verification section for applying a verification voltage, and wherein a level of the program voltage increases by a first program voltage increment in response to the first program loop being repeated, and the second program operation comprises a plurality of second program loops, each of the second program loops comprises a program section for applying a program voltage and a verification section for applying a verification voltage, and wherein a level of the program voltage increases by a second program voltage increment in response to the second program loop being repeated, and wherein the first program voltage increment is greater than the second program voltage increment.

11. The storage device of claim 7, wherein a peak current of the first program operation is greater than a peak current of the second program operation.

12. The storage device of claim 1, wherein the storage controller is further configured to transmit a fast program command to the non-volatile memory via data lines, each of the plurality of non-volatile memories outputs a ready/busy signal to the storage controller during a third program time in response to the fast program command, and the third program time is shorter than the first program time.

13. A method of operating a storage device including a storage controller and a non-volatile memory, the method comprising:

transmitting a normal program command by the storage controller to the non-volatile memory via data lines;

outputting a ready/busy signal by the non-volatile memory to the storage controller during a first program time in response to the normal program command;

transmitting a second level program command by the storage controller to the non-volatile memory via the data lines; and outputting a ready/busy signal by the non-volatile memory to the storage controller during a second program time in response to the second level program command, wherein the second program time is longer than the first program time.

14. The method of claim 13, further comprising:

transmitting, a third level program command by the storage controller to the non-volatile memory via the data lines; and outputting, a ready/busy signal by the non-volatile memory to the storage controller during a third program time in response to the third level program command, wherein the third program time is longer than the second program time.

15. The method of claim 13, further comprising transmitting, a first level program command by the storage controller to the non-volatile memory via the data lines; and outputting, a ready/busy signal by the non-volatile memory to the storage controller during a fourth program time in response to the first level program command, wherein the fourth program time is shorter than the first program time.

16. The method of claim 13, further comprising transmitting, a set feature command by the storage controller to the non-volatile memory, wherein the set feature command includes information including a number of levels and information including program times corresponding to the levels.

17. The method of claim 13, further comprising calculating, a total peak current by the storage controller by adding peak current values of operations that are being performed;

comparing the total peak current with a reference current;

transmitting the second level program command to the non-volatile memory in response to the total peak current being greater than the reference current; and transmitting the normal program command to the non-volatile memory in response to the total peak current being less than or equal to the reference current.

18. A non-volatile memory device comprising:

a memory cell array comprising a plurality of memory cells;

a row decoder connected to the memory cells via a word line and applying a program voltage and a verification voltage to the word line during a program operation;

a page buffer circuit connected to the memory cell array via a bit line and applying a bit line voltage corresponding to data to be programmed to a selected bit line;

an input/output (I/O) circuit receiving data or commands from outside via data lines and transmitting the data to the page buffer circuit; and a logic control circuit configured to output a ready/busy signal during a first program time in response to a normal program command received via the I/O circuit, and output a ready/busy signal during a second program time in response to a slow program command received via the I/O circuit, and wherein the second program time is longer than the first program time.

19. The non-volatile memory device of claim 18, wherein the row decoder applies a program voltage rising with a first slope to a selected word line in response to the normal program command, and applies a program voltage rising with a second slope to a selected word line in response to the slow program command, and wherein the first slope is greater than the second slope.

20. The non-volatile memory device of claim 18, wherein the row decoder performs a plurality of program loops based on a first program voltage increment in response to the normal program command, and performs a plurality of program loops based on a second program voltage increment in response to the slow program command, and wherein the first program voltage increment is greater than the second program voltage increment.

* * * * *